US012025845B2

(12) United States Patent
Wang et al.

(10) Patent No.: US 12,025,845 B2
(45) Date of Patent: Jul. 2, 2024

(54) CABLE SUPPORT SYSTEM HAVING MULTI-POSITION PARTITION

(71) Applicant: COMMSCOPE TECHNOLOGIES LLC, Hickory, NC (US)

(72) Inventors: Jing Wang, Jiangsu (CN); Wenyong Wu, Jiangsu (CN); Danny Ghislain Thijs, Zonhoven (BE); Christine Anne Dooley, Lewisville, NC (US)

(73) Assignee: COMMSCOPE TECHNOLOGIES LLC, Hickory, NC (US)

( * ) Notice: Subject to any disclaimer, the term of this patent is extended or adjusted under 35 U.S.C. 154(b) by 0 days.

(21) Appl. No.: 17/517,081

(22) Filed: Nov. 2, 2021

(65) Prior Publication Data

US 2022/0057588 A1 Feb. 24, 2022

Related U.S. Application Data

(63) Continuation of application No. 16/608,550, filed as application No. PCT/US2018/029979 on Apr. 27, 2018, now Pat. No. 11,567,279.

(30) Foreign Application Priority Data

Apr. 28, 2017 (CN) .......................... 201710294792.1
Apr. 28, 2017 (CN) .......................... 201710294794.0
Apr. 28, 2017 (CN) .......................... 201710294795.5

(51) Int. Cl.
*G02B 6/44* (2006.01)
*A47B 97/00* (2006.01)
(Continued)

(52) U.S. Cl.
CPC .......... *G02B 6/4452* (2013.01); *B65H 75/146* (2013.01); *E05B 41/00* (2013.01);
(Continued)

(58) Field of Classification Search
CPC ..... G02B 6/4452; G02B 6/4457; E05B 41/00; E05D 7/10; E06B 7/28; H05K 7/1491;
(Continued)

(56) References Cited

U.S. PATENT DOCUMENTS 2,650,388 A 9/1953 White
2,905,408 A * 9/1959 Stetka .................... B65H 75/22
242/578.2

(Continued)

FOREIGN PATENT DOCUMENTS

AU 2007211866 A1 10/2010
CA 2892498 A1 5/2014
(Continued)

OTHER PUBLICATIONS

International Search Report and Written Opinion of the International Searching Authority for International Patent Application No. PCT/US2018/029979 dated Aug. 7, 2018, 17 pages.

(Continued)

*Primary Examiner* — Hanh V Tran
(74) *Attorney, Agent, or Firm* — Merchant & Gould P.C.

(57) ABSTRACT

A system for improved cable management is disclosed in several example embodiments. The disclosed embodiments describe example structures for supporting cables, for example telecommunications and fiber optic cables, within a cable storage cabinet. The disclosed embodiments also describe a door for a cable storage cabinet. The example door includes a hinge control and handle system which allows the door to be opened along either side to therefore allow the door to be opened either way from a single handle. The disclosed embodiments also describes an indicator system which informs a user when the door for the cable storage cabinet is in either a closed position or an open position. Each of these embodiments improves the utility (Continued)

and safety of cable management, particularly within cable storage cabinets.

19 Claims, 37 Drawing Sheets

(51) Int. Cl.

| | | |
|---|---|---|
| *B65H 75/14* | (2006.01) | |
| *E05B 41/00* | (2006.01) | |
| *E05C 9/02* | (2006.01) | |
| *E05D 7/10* | (2006.01) | |
| *E06B 7/28* | (2006.01) | |
| *H05K 7/14* | (2006.01) | |

(52) U.S. Cl.
CPC .................. *E05D 7/10* (2013.01); *E06B 7/28* (2013.01); *G02B 6/4457* (2013.01); *H05K 7/1491* (2013.01); *A47B 2097/003* (2013.01); *E05C 9/02* (2013.01); *E05Y 2900/20* (2013.01)

(58) Field of Classification Search
CPC ....... A47B 2097/003; E05C 9/02; E05C 9/14; E05C 9/16; E05Y 2900/20; H04Q 1/025; H04Q 1/064; B65H 75/146; A47F 7/005
See application file for complete search history.

(56) References Cited

U.S. PATENT DOCUMENTS

| | | | | |
|---|---|---|---|---|
| 3,403,473 A * | 10/1968 | Navarro | ................ | E05D 15/502 |
| | | | | 16/230 |
| 3,921,251 A | 11/1975 | Blok | | |
| 4,683,732 A * | 8/1987 | Beattie | ................ | E05B 65/0075 |
| | | | | 292/68 |
| 4,917,323 A * | 4/1990 | Wing | ................... | B65H 75/406 |
| | | | | D8/358 |
| 5,339,379 A * | 8/1994 | Kutsch | ................. | G02B 6/4452 |
| | | | | 385/135 |
| 5,364,042 A * | 11/1994 | Wyman | ................. | G03B 27/588 |
| | | | | 242/348 |
| 5,640,482 A * | 6/1997 | Barry | .................... | H04Q 1/064 |
| | | | | 385/136 |
| 6,000,771 A * | 12/1999 | Wissinger | ................ | F25D 23/02 |
| | | | | 312/401 |
| 6,256,444 B1 * | 7/2001 | Bechamps | ........... | G02B 6/4452 |
| | | | | 385/136 |
| 6,398,149 B1 | 6/2002 | Hines et al. | | |
| 6,688,657 B2 * | 2/2004 | Peacock | .................... | E05C 9/16 |
| | | | | 292/35 |
| 7,083,051 B2 * | 8/2006 | Smith | .................... | H04Q 1/064 |
| | | | | 248/220.42 |
| 7,637,771 B2 * | 12/2009 | Laursen | ................. | H04Q 1/064 |
| | | | | 439/501 |
| 8,042,699 B2 | 10/2011 | Leichter | | |
| 8,395,046 B2 | 3/2013 | Nicewicz | | |
| 8,415,831 B1 | 4/2013 | Hayes, Jr. et al. | | |
| 8,558,113 B2 * | 10/2013 | Krietzman | ............. | H02G 3/045 |
| | | | | 174/72 A |
| 8,960,815 B2 | 2/2015 | Karandikar et al. | | |
| 9,169,669 B2 | 10/2015 | Clary | | |
| 9,345,346 B1 * | 5/2016 | O'Flaherty | ............ | B65H 75/36 |
| 9,547,145 B2 * | 1/2017 | Cox | ..................... | G02B 6/4466 |
| 9,624,693 B2 | 4/2017 | Vandewall | | |
| 9,945,158 B2 | 4/2018 | Lehner, Jr. | | |
| 10,211,611 B2 * | 2/2019 | Bier | ....................... | B26D 3/166 |
| 10,271,452 B2 | 4/2019 | Heinrich | | |
| 10,302,885 B2 * | 5/2019 | Morris | .................... | G02B 6/445 |
| 10,343,871 B2 * | 7/2019 | Parke | .................... | G02B 6/4463 |
| 10,550,988 B2 * | 2/2020 | Strom | ................... | B65H 75/425 |
| 10,690,874 B2 * | 6/2020 | Haataja | ................. | G02B 6/4452 |
| 10,920,466 B2 | 2/2021 | Long | | |
| 11,073,671 B2 | 7/2021 | Masuda | | |
| 11,177,637 B1 * | 11/2021 | Jordan | ................... | H02G 1/081 |
| 11,567,279 B2 | 1/2023 | Wang et al. | | |
| 2002/0095960 A1 | 7/2002 | Grover | | |
| 2003/0080567 A1 * | 5/2003 | Peacock | .................. | G06F 1/181 |
| | | | | 292/3 |
| 2005/0247650 A1 | 11/2005 | Vogel | | |
| 2006/0068633 A1 | 3/2006 | Murano | | |
| 2006/0162948 A1 | 7/2006 | Rinderer et al. | | |
| 2007/0189693 A1 * | 8/2007 | Smrha | .................. | G02B 6/4452 |
| | | | | 385/136 |
| 2008/0079340 A1 * | 4/2008 | Adducci | ................. | H05K 7/186 |
| | | | | 312/286 |
| 2009/0294388 A1 | 12/2009 | Leichter | | |
| 2010/0290752 A1 * | 11/2010 | Newman | ................ | H04Q 1/023 |
| | | | | 174/135 |
| 2011/0016938 A1 | 1/2011 | Chi | | |
| 2012/0019117 A1 | 1/2012 | Dunwoody et al. | | |
| 2012/0273438 A1 * | 11/2012 | Nordin | ................. | H05K 7/1491 |
| | | | | 211/26 |
| 2014/0197261 A1 | 7/2014 | Witherbee | | |
| 2015/0225982 A1 | 8/2015 | Bronner | | |
| 2015/0274405 A1 * | 10/2015 | Nahm | .................... | B65D 25/10 |
| | | | | 206/407 |
| 2016/0010361 A1 | 1/2016 | Smith | | |
| 2016/0060918 A1 | 3/2016 | Garrett | | |
| 2016/0230423 A1 | 8/2016 | Lehner, Jr. | | |
| 2016/0299308 A1 | 10/2016 | Wiltjer et al. | | |
| 2016/0313527 A1 | 10/2016 | Fordham | | |
| 2020/0079614 A1 * | 3/2020 | Cigarini | ............... | B65H 75/146 |

FOREIGN PATENT DOCUMENTS

| | | | | |
|---|---|---|---|---|
| CN | 1711780 A | 12/2005 | | |
| CN | 101039450 A | 9/2007 | | |
| CN | 101534623 A | 9/2009 | | |
| CN | 102177633 A | 9/2011 | | |
| CN | 102997592 A | 10/2015 | | |
| DE | 541969 C | 1/1932 | | |
| DE | 102007012980 A1 * | 9/2008 | ............... | E05C 9/00 |
| DE | 202015105909 U1 | 2/2017 | | |
| ES | 255361 A1 | 4/1960 | | |
| GB | 2 329 889 A | 4/1999 | | |
| GB | 2 355 313 A | 4/2001 | | |
| GB | 2 356 062 A | 5/2001 | | |
| GB | 2 469 302 A | 10/2010 | | |
| KR | 20140005746 U | 11/2014 | | |
| KR | 20160063785 A | 6/2016 | | |
| WO | WO-02103429 A2 * | 12/2002 | ........... | G02B 6/3897 |
| WO | 2013/124204 A1 | 8/2013 | | |
| WO | 2016/040548 A1 | 3/2016 | | |
| WO | WO-2017139359 A1 * | 8/2017 | ............. | B65H 49/32 |
| WO | 2018/031453 A1 | 2/2018 | | |
| WO | WO-2018031453 A1 * | 2/2018 | ........... | G02B 6/4439 |
| WO | WO-2020043896 A1 * | 3/2020 | ........... | G02B 6/3897 |

OTHER PUBLICATIONS

Extended European Search Report for corresponding European Patent Application No. 18790724.1 dated Dec. 18, 2020, 7 pages.

\* cited by examiner

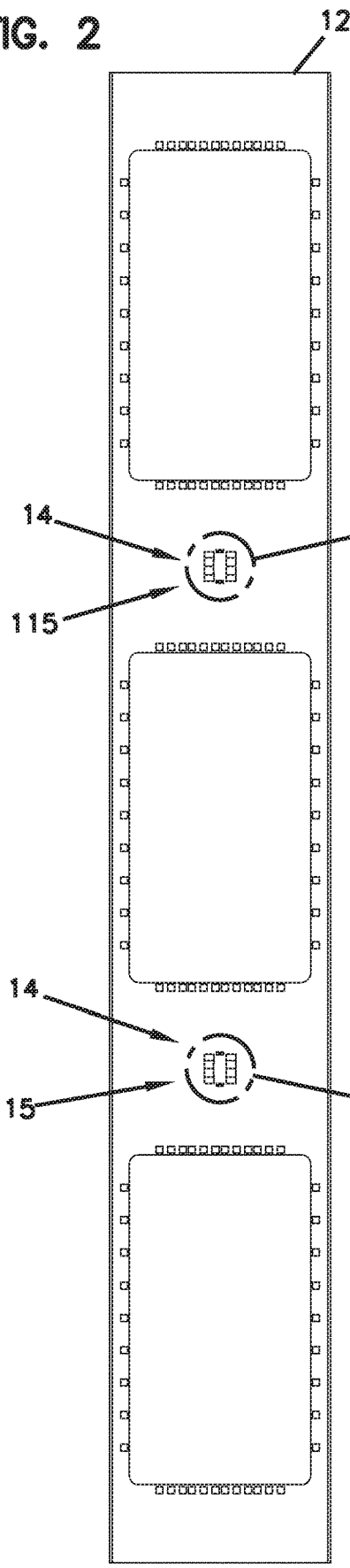
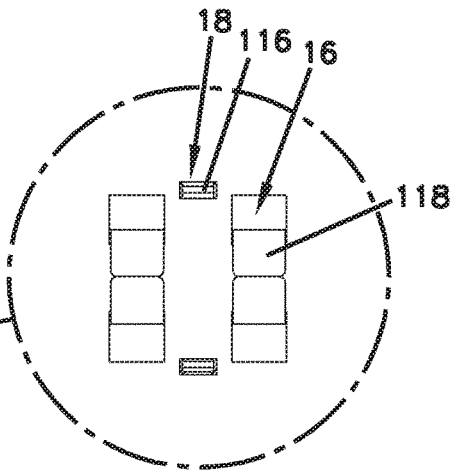
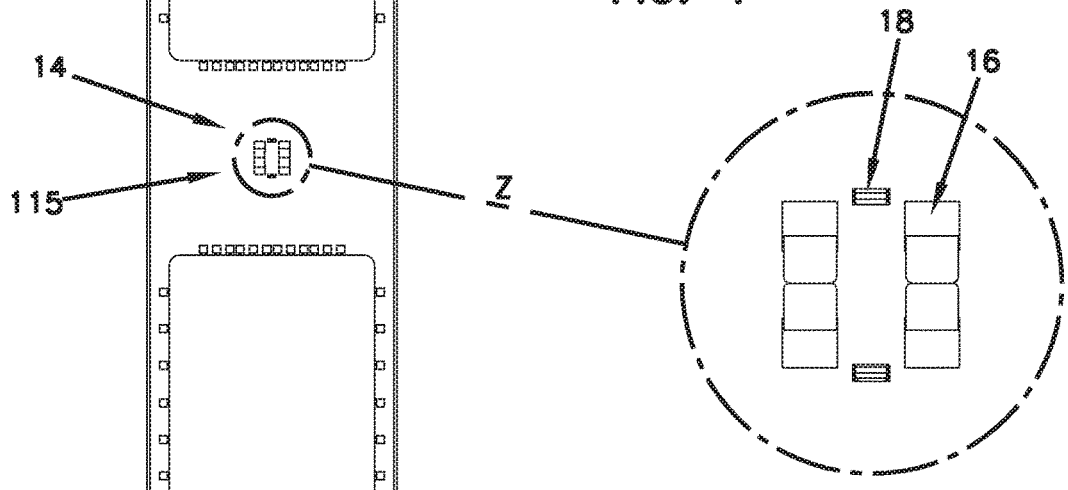

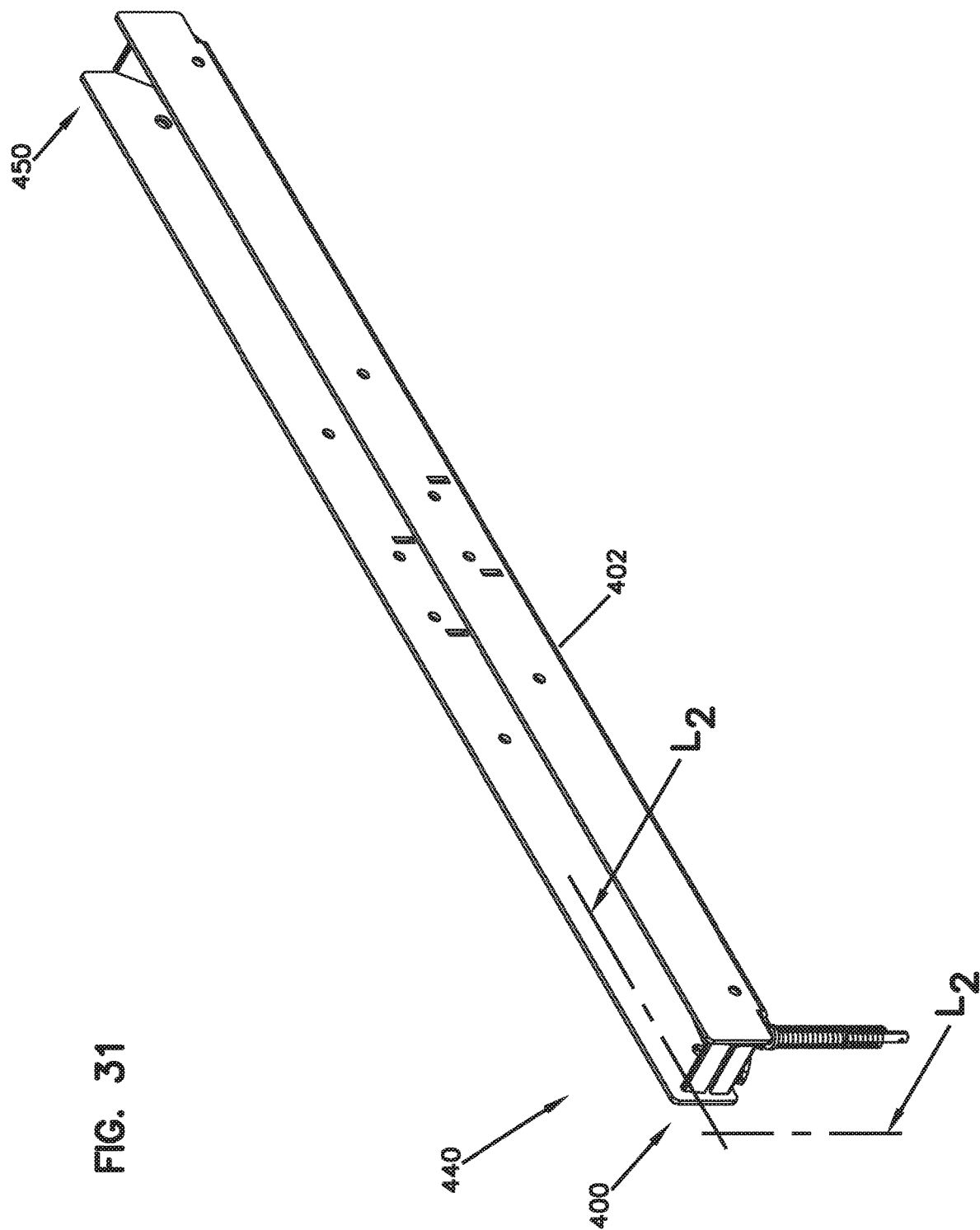

CABLE SUPPORT SYSTEM HAVING MULTI-POSITION PARTITION

CROSS-REFERENCE TO RELATED APPLICATIONS

This application is a continuation of U.S. patent application Ser. No. 16/608,550, filed on Oct. 25, 2019, now U.S. Pat. No. 11,567,279, which is a National Stage Application of PCT/US2018/029979, filed on Apr. 27, 2018, which claims the benefit of Chinese Patent Application No. 201710294795.5, filed on Apr. 28, 2017, and claims the benefit of Chinese Patent Application No. 201710294794.0, filed on Apr. 28, 2017, and claims the benefit of Chinese Patent Application No. 201710294792.1, filed on Apr. 28, 2017, the disclosures of which are incorporated herein by reference in their entireties. To the extent appropriate, a claim of priority is made to each of the above disclosed applications.

TECHNICAL FIELD

The present disclosure relates generally to cable management, and more particularly to cable management with a cable storage cabinet.

BACKGROUND

Cables, for example fiber optic telecommunication cables, are often stored in cabinets. When users access these cabinets to install or service the cables, adjustments to the equipment used for storage is often necessary. In many cases, users are not able to immediately obtain different storage management equipment to adapt to the circumstances, such as cable number or size, so the user must return to a remote office, wasting valuable time. It is therefore needed to develop advancements in cable management which can be adjusted in the field.

These cabinets often are enclosed with very heavy doors, which can cause injury if not closed properly. It is therefore needed to develop advancements in cable management which can indicate to a user when a cabinet door is properly closed.

The cabinets are often positioned in confined surroundings and have difficulty-accessed internal cavities. It is therefore needed to develop advancements in cable management cabinets which can increase accessibility in confined surroundings and also provide improved accessibility to internal cavities which are difficult to access.

SUMMARY

A system for improved cable management is disclosed in several example embodiments. The disclosed embodiments describe example structures for supporting cables, for example telecommunications and fiber optic cables, within a cable storage cabinet. The disclosed embodiments also describe a door for a cable storage cabinet. The example door includes a hinge control and handle system which allows the door to be opened along either side to therefore allow the door to be opened either way from a single handle. The disclosed embodiments also describes an indicator system which informs a user when the door for the cable storage cabinet is in either a closed position or an open position. Each of these embodiments improves the utility and safety of cable management, particularly within cable storage cabinets.

In one aspect, the present invention relates to in indicator to show the status of a door as being open or closed including an indicator including an indicator stimulus that indicates when a door is closed, and a cover to block the indicator stimulus to indicate when the door is open. The cover is manipulated by the condition of the door as being open or closed.

In another aspect, the present invention relates to an indicator system to show the status of a door as being open or closed including a ram, including a contact end, fixed to a door, an indicator including an indicator stimulus that indicates when the door is closed, and a cover to block the indicator stimulus to indicate when the door is open. The cover is manipulated by the ram contact end.

In another aspect, the present invention relates to a method for showing the status of a door as being open or closed. The method including deflecting a cover away from an indicator stimulus by engaging the cover with a ram on a door when the door is closed, and blocking the indicator stimulus with the cover by disengaging the cover from the ram when the door is open.

In another aspect, the present invention relates to a cabinet including a frame that includes a frame member. The frame member includes a first extension and a second extension. The second extension is movable between first and second states. The first and second extensions overlap in the first state and do not overlap in the second state. The cabinet also includes a door hingedly secured to the frame with a movable plunger supported on the door. The movable plunger engages the second extension in the second state and does not engage the second extension in the first state.

In another aspect, the present invention relates to a system for opening a door that includes a first side edge and an opposite second side edge. The system includes a handle that is mechanically operable in a first direction to open the door only along the first side edge, or in a second direction to open the door only along the second side edge. The system also includes a first hinge mechanism that is operably connected to the handle to releasably secure the door along the first side edge. The system also includes a second hinge mechanism that is operably connected to the handle to releasably secure the door along the second side edge.

In another aspect, the present invention relates to a method of opening a door along either a first side edge or a second side edge with a single handle. The method includes rotating a handle in a first direction to release the first side edge of the door from a fixed condition while maintaining the second side edge of the door in a fixed condition. The method alternatively includes rotating the handle in a second direction to release the second side edge of the door from a fixed condition while maintaining the first side edge of the door in a fixed condition.

In another aspect, the present invention relates to a cable management device including a cable carrier extending along an axis between a free end and a mounting end, at least one partition selectably supported by the cable carrier, and a repositioning system for repositioning the at least one partition along the axis to a plurality of positions between the free end and the mounting end of the cable carrier.

In another aspect, the present invention relates to a cable management device including a spool extending along an axis between a free end and a mounting end, at least one partition plate repositionably supported by the spool, and a repositioning system for repositioning the at least one partition plate along the axis to a plurality of positions between the free end and the mounting end of the spool. The present invention can optionally define a base with at least one mounting receiver for receiving at least one of the cable management devices.

In another aspect, the present invention relates to a cable management system including a base comprising a mounting receiver, a carrier comprising a mounting end and a free end, the mounting end comprising a mounting assembly removably mounted to the base mounting receiver, and at least one selectable partition system supported by the carrier, the selectable partition system comprising at least one partition selectably supported at a plurality of positions between the mounting end and the free end.

In another aspect, the present invention relates to a method for managing cable including mounting a cable carrier to a base, the cable carrier comprising a repositionable cable management system and at least one divider, positioning the at least one divider to a first position on the repositionable cable management system, and receiving at least one length of cable on the cable carrier.

BRIEF DESCRIPTION OF THE DRAWINGS

FIG. 2 is a rear view of the cable management system shown in FIG. 1.

FIG. 3 is an isolated and enlarged view of window Y in FIG. 2.

FIG. 4 is an isolated and enlarged view of window Z in FIG. 2.

FIG. 31 is a perspective view of an example indicator system, according to another embodiment of the disclosure, as shown in the closed position.

DESCRIPTION OF EXAMPLE EMBODIMENTS

Cable Support System

A novel system for cable support is disclosed. In use, the cable support system can be adjusted to accommodate and organize multiple different cables and cables of different widths. If alterations are required due to size or number changes, a user can adjust the arrangement of the cable support system in the field without having to obtain a differently-sized or arranged structure. As a result, the cable support system provides increased convenience and effectiveness to the user.

Figure 1:
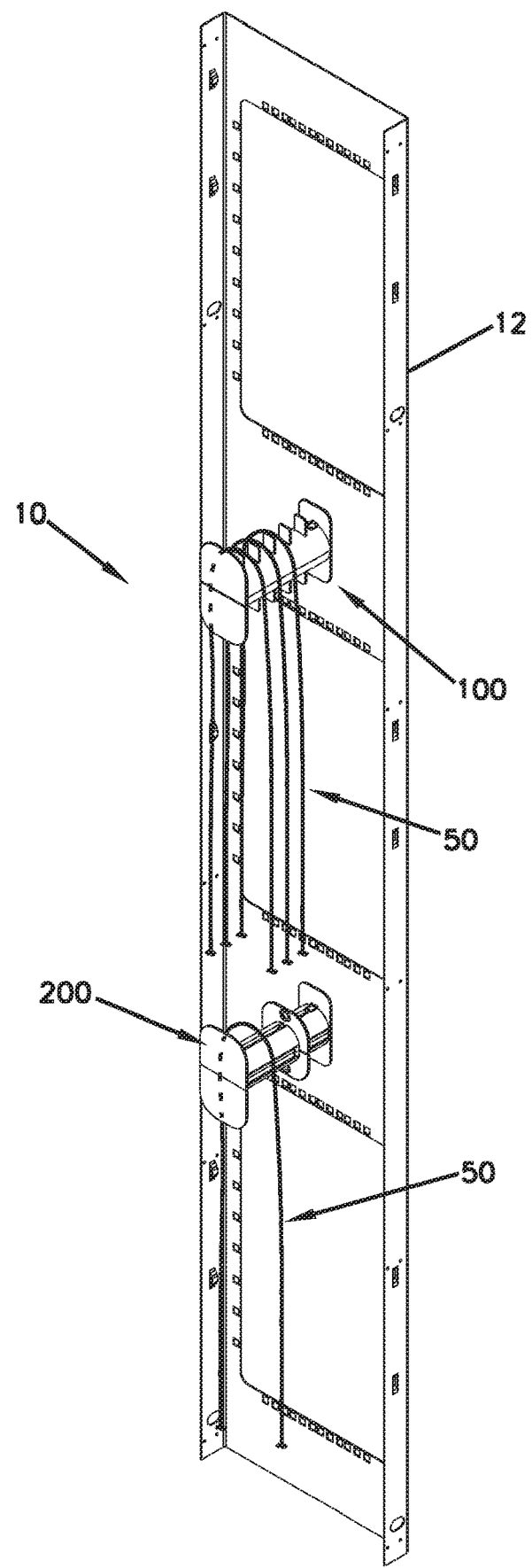
FIG. 1 is a front perspective view of an example cable management system according to an embodiment of the disclosure.

An example cable support system includes a support structure. The support structure further includes a mounting receiver system to readily attach and detach at least one cable carrier. An example support structure 10 is illustrated in FIGS. 1-2 as a cabinet frame 12. An example mounting receiver system 14 is illustrated in FIGS. 2-4 to include at least one grip aperture 16 extending through the frame 12. The illustrated mounting receiver system 14 preferably includes a pair of identical grip apertures 16. The illustrated mounting receiver system 14 also includes at least one insert aperture 18 extending through the frame 12 at a position between the pair of grip apertures 16.

An example cable support system also includes at least one cable support, which can be removably secured to the base structure. A removably secured cable support can be mounted to the above described mounting receiver system with a mounting mechanism. The mounting mechanism is preferably a unitary, and monolithic, structure with the cable support. The cable support provides a structure that holds cables that are stored within the cable management system. The cable support also includes an adjustment mechanism that allows a user to selectably adjust the utility and structure in response to cables of different dimensions or in response to a need for separating multiple cables. The adjustment mechanism (or selectable partition system) can be a single mechanism that can adjust (or reposition) itself along or with respect to the cable support. The adjustment mechanism can also be a system of insertable and removable dividers which form different channels or pathways along or with respect to the cable support. By allowing for selectable adjustment (or repositioning) of the cable support, a user can select changes in the field instead of having to order an entirely new device.

An example cable support is illustrated in FIGS. 1 and 5-10 as a first spool 100 removably secured to the cabinet frame 12 through the above-described mounting receiver system, and supporting a plurality of cables 50, which can hang over the spool as illustrated. The illustrated spool 100 can be constructed of two parts, preferably two halves, more preferably two identical halves, illustrated as first half A and second half B, engaged along a longitudinal axis X. The illustrated spool 100 includes a carrier body 102 that is defined between a proximal mounting end 104 and a distal free end 106. The carrier body 102 can have any shape or dimension which allows for support of at least one cable. The illustrated proximal mounting end 104 includes a proximal barrier wall 126, which in use engages the surface of the cabinet frame 12. The illustrated distal free end 106 includes a distal barrier wall 124, which in use prevents any supported cables from falling off the distal end of the carrier body 102.

As particularly depicted in FIGS. 2-4 and 6-8, the illustrated carrier body 102 removably secures to the above described mounting receiver system on the frame 12 with a mounting system 115. The illustrated carrier body 102 illustrates an example mounting system 115 that includes at least one bracket 118. As illustrated, the example mounting system 115 can include a pair of brackets 118. The illustrated bracket 118 has an elbow, for example an "L" shaped geometry extending proximally away from the proximal surface of the proximal barrier 126. The geometry of the elbow shaped bracket 118 forms a receiver space 122 between the proximal barrier 126 and the bracket. In operation, for example as illustrated in FIGS. 2-4, the bracket 118 is inserted through a grip aperture 14 in the frame 12 so that a portion of the body of the frame fits within the receiver space 122. When the body of the frame 12 is within the receiver space 122, it is engaged between the bracket 118 and the proximal barrier 126, thus providing a resistive force to prevent the bracket from falling out of the grip aperture 14.

The example mounting system 115 can also include a latch to operate simultaneously with, or independently from, the bracket(s) 118. An illustrated example latch includes a handle 112 which pivots with respect to the proximal barrier 126 and the carrier body 102. The handle 112 can be unitary, or monolithic, with the spool 100. The handle 112 pivots within a channel 114 cut out from the spool 100 across the proximal barrier 126 and the carrier body 102. The illustrated handle 112 can have an elbow shape with a neck portion (see FIG. 8) pivotally attached to, and pivoting within a section of the channel 114 cut out from, the proximal barrier 126. The handle 112 can also have a button portion (see FIGS. 5 & 7) pivoting within a portion of the channel 114 that is cut out from the carrier body 102. When a user applies a depressive force onto the button portion of the handle 112, the handle pivots away from the carrier body 102 surface and into the channel 114.

The illustrated pivot latch also includes an insert plug 116 protruding in the proximal direction away from the proximal barrier 126. The illustrated insert plug 116 is positioned near the intersection of the neck portion and the button portion of the handle 112. As particularly illustrated in FIGS. 6-7, when the handle 112 is in a relaxed and non-pivoted state, the insert plug 116 extends through the channel 114 and proximally beyond the proximal barrier 126. In this relaxed condition, if the mounted spool 100 tilts downward and away from the frame 12, the insert plug 116 prevents the spool from dismounting from the frame by engaging the frame at the edge of the channel 114. When the button portion of the handle 112 is in a depressed and position, the handle pivots into the channel 114, causing the insert plug 116 to retract distally away from the proximal barrier 126 through and away from the channel. When the insert plug 116 is pivotally retracted through the channel 114, the insert plug will not engage the frame 14 if the spool 100 is tilted away from the frame. Preferably, the insert plug 116 is unitary, or monolithic, with the handle 112.

The illustrated carrier body 102 includes an example adjustment mechanism, as described above. The illustrated adjustment mechanism includes a plurality of slots 108 separately positioned along the carrier body 102 between the proximal mounting end 104 and the distal free end 106. Each slot 108 can be an aperture providing access into the interior of the carrier body 102. Each slot 108 can be separated from adjacent slots by an even, or uneven, distance from each other.

Figure 9:
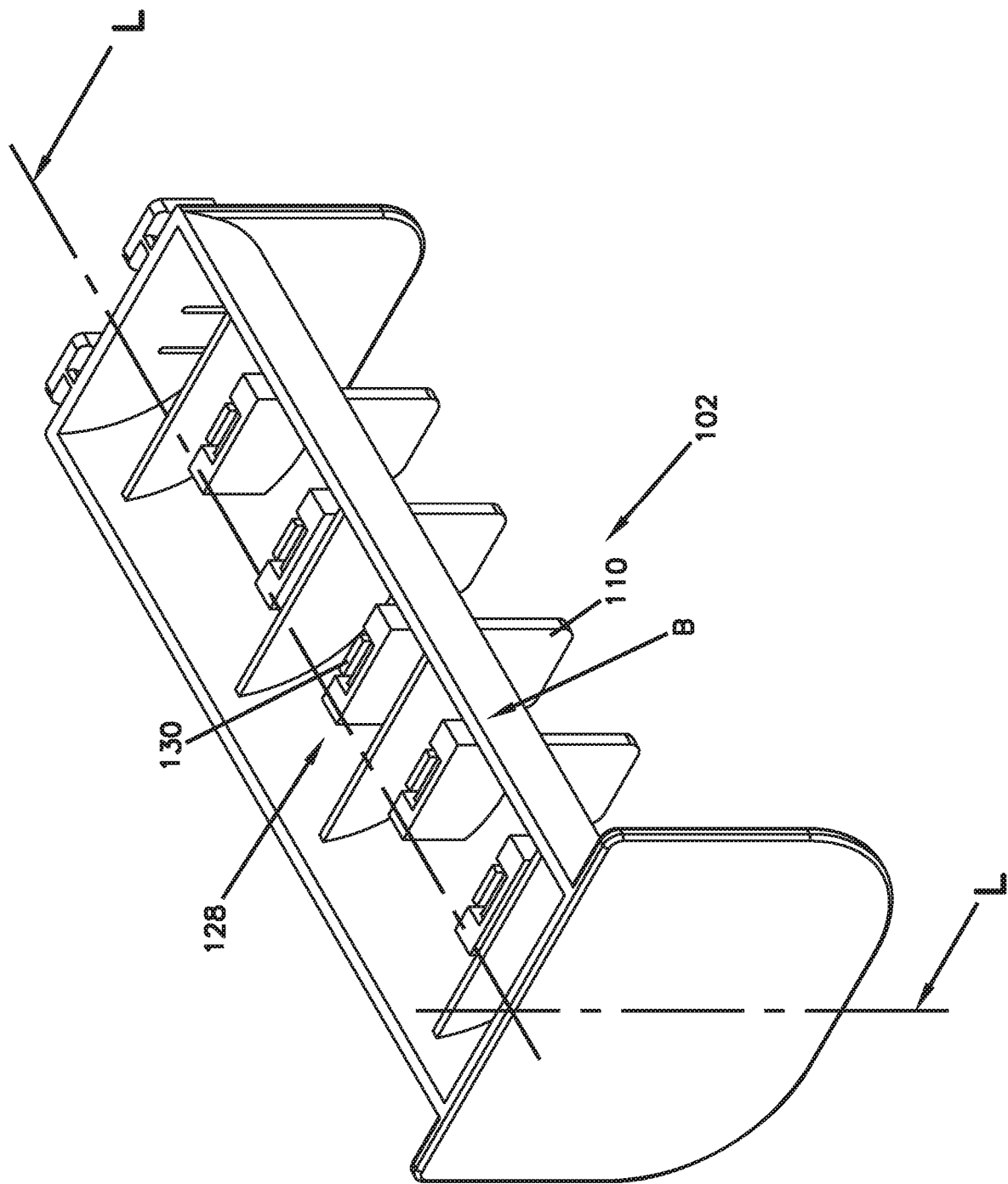
FIG. 9 is an isolated perspective view of a half of the first cable support shown in FIG. 5.
Figure 10:
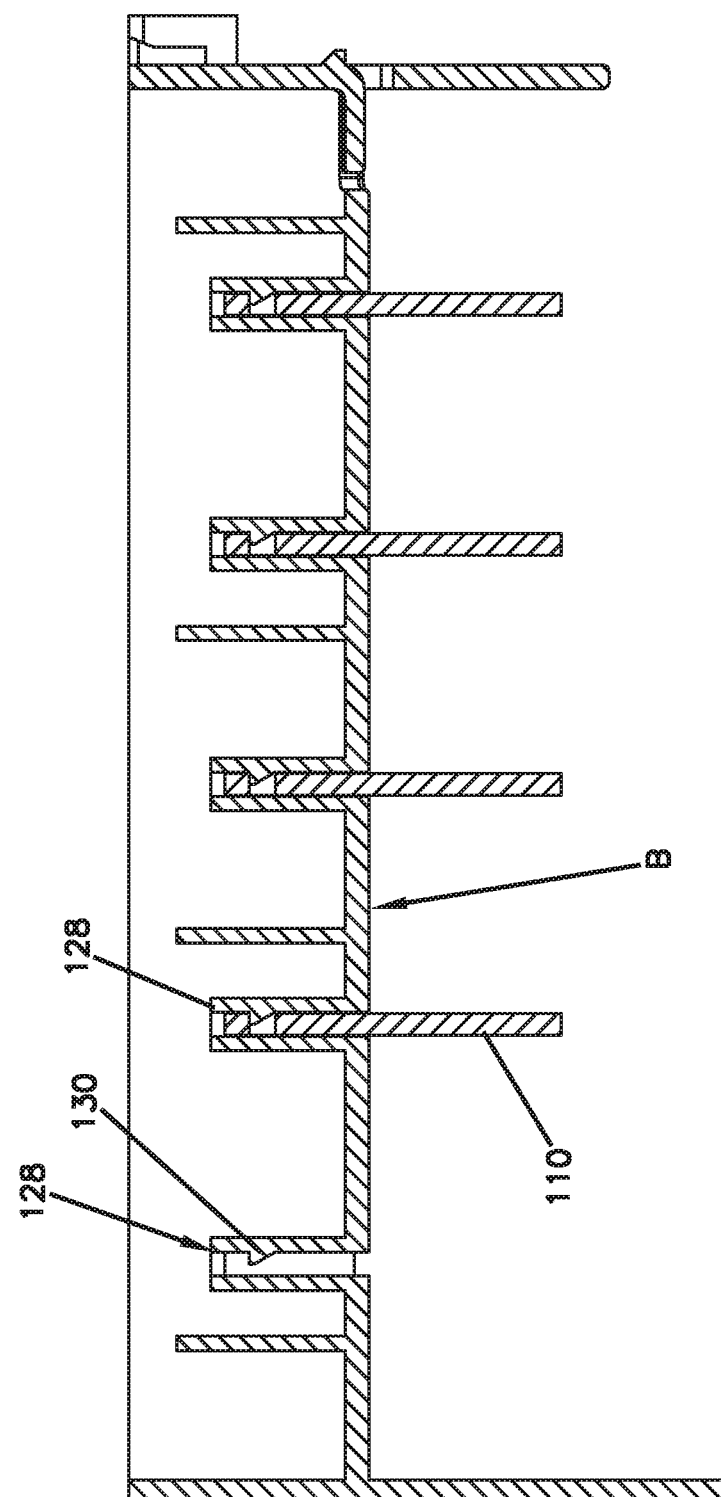
FIG. 10 is a cross sectional view of the first cable support half shown in FIG. 9, as viewed along line L.

The adjustment mechanism can also include a plurality of receivers 128, as illustrated in FIGS. 9 & 10, positioned within the carrier body 102 and operably aligned with the slots 108. Preferably, each slot 108 is aligned with a receiver 128. The illustrated receivers 128 can include a locking mechanism 130 which pivots or deflects with respect to the receiver 128. The illustrated locking mechanism 130 can include a protruding insert with a ramped surface. A user deflects the locking mechanism 130 to provide access into the receiver 128.

The illustrated adjustment mechanism includes a plurality of dividers 110 (or "partitions"). The illustrated dividers 110 can be planar plates which removably insert into the slots 108 and secure into the receivers 128. The adjustment mechanism can be used with a variety of configurations, for example only one divider 110 inserted into one slot 108 and receiver 128, or a plurality of dividers inserted into a plurality of slots and receivers. Additionally, the position of a particular divider 110 can be adjusted or moved between different slots 108 and receivers 128 in order to change the configuration of the adjustment mechanism depending on the dimension or number of cable(s) to be carried on the carrier body 102.

Figure 11:
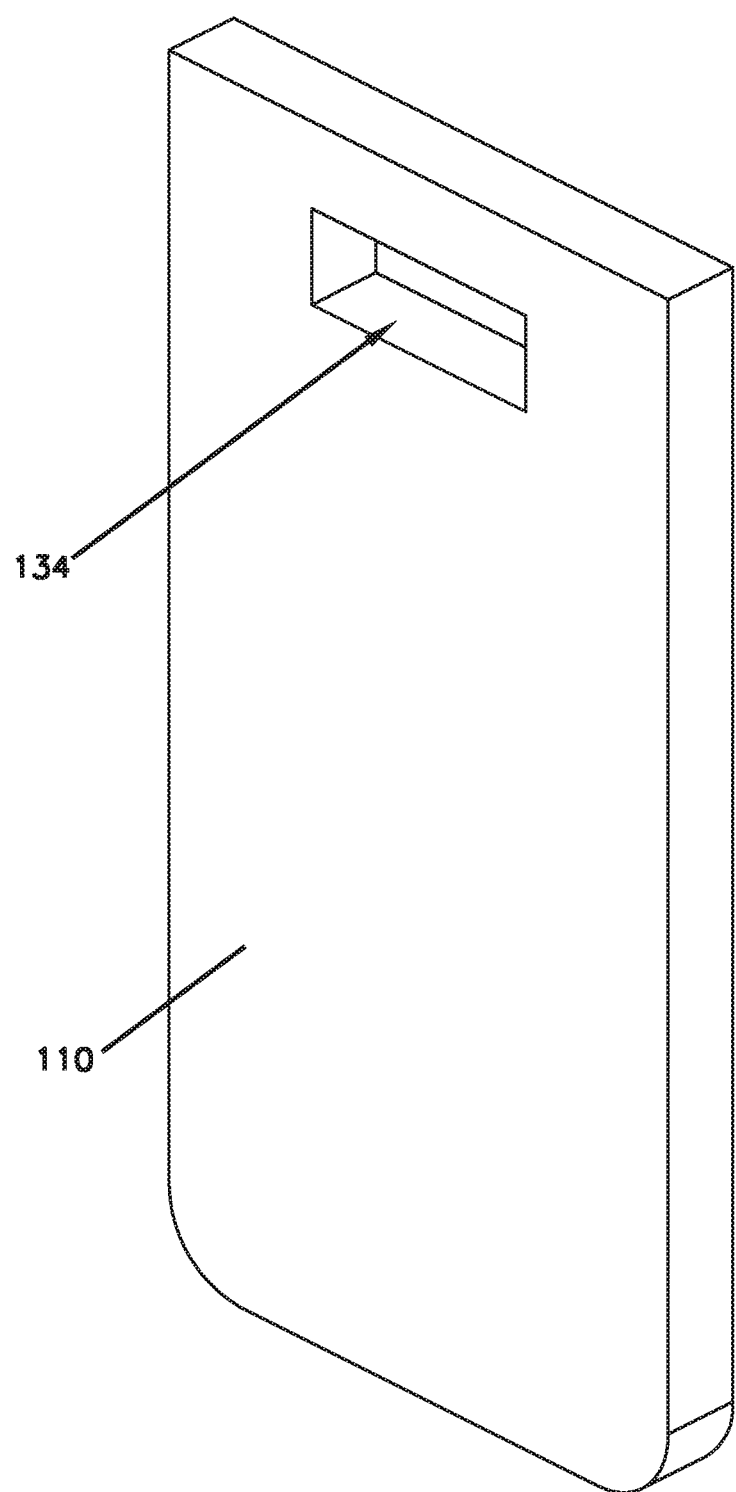
FIG. 11 is a perspective view of the partition shown in FIG. 5, shown isolated from the first cable support.

As particularly illustrated in FIG. 11, an example divider 110 can include a keyhole 134, which can be a recession or an aperture in the divider. The keyhole 134 is positioned to receive the protruding insert of the locking mechanism 130 when the divider 110 is inserted through the slot 108 and into the receiver 128. When inserted into the receiver 128, the divider 110 engages the ramped surface of the protruding insert and deflects the locking mechanism 130. Then the keyhole 134 receives the protruding insert of the locking mechanism 130 once the divider 110 has been inserted a sufficient distance. When the locking mechanism 128 is secured within the keyhole 134, the divider 110 is prevented from being removed from the receiver 128 and slot 108. To remove the divider 110 from the receiver 128 and slot 108, a user applies a deflecting force to the locking mechanism 130 away and out of the keyhole 134.

The illustrated halves A and B are preferably identical. Each includes a proximal barrier 126, a distal barrier 124, a carrier body 102, mounting system 115, slots 108 and receivers 128.

Figure 5:
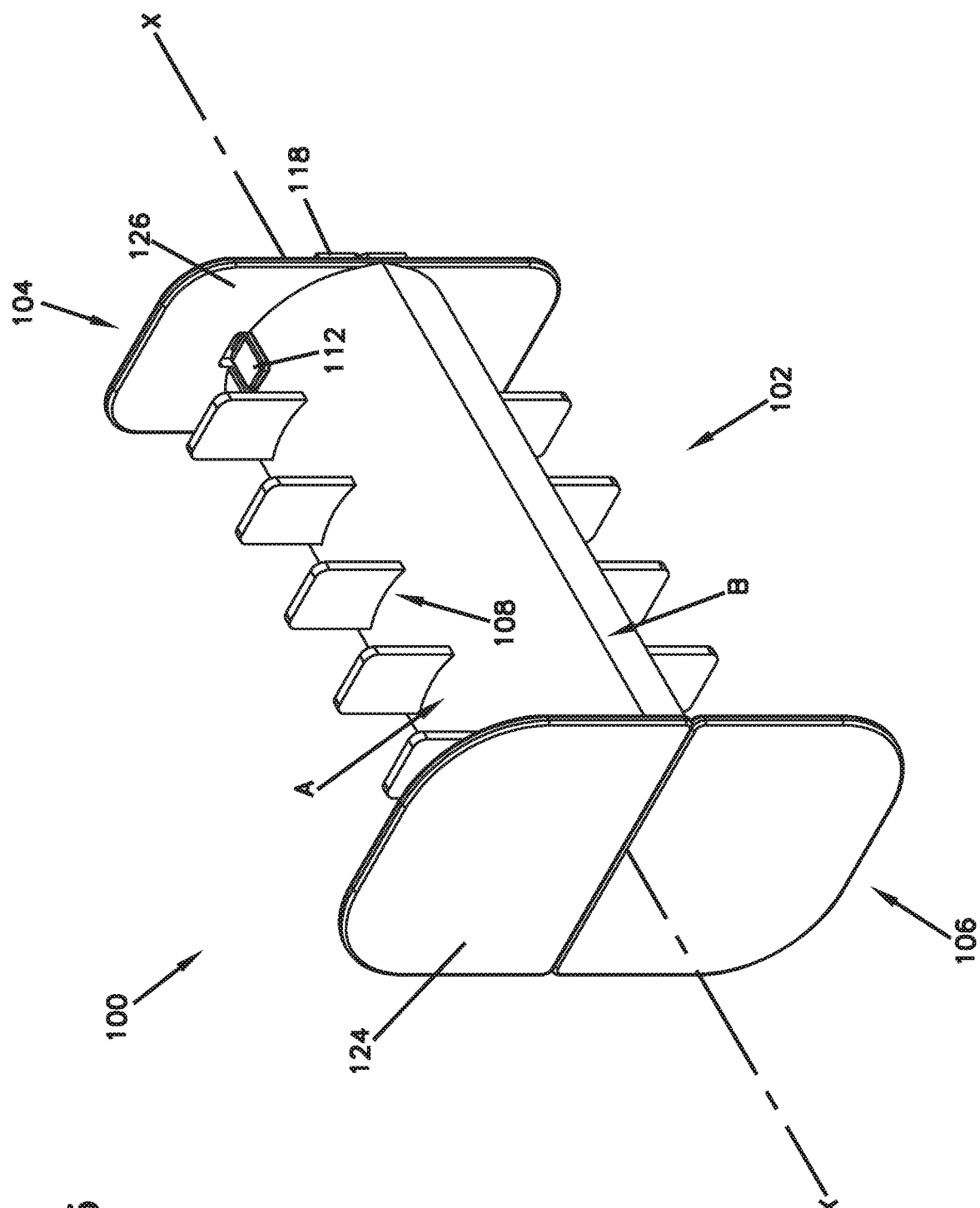
FIG. 5 is a perspective view of a first cable support shown in FIG. 1.
Figure 6:
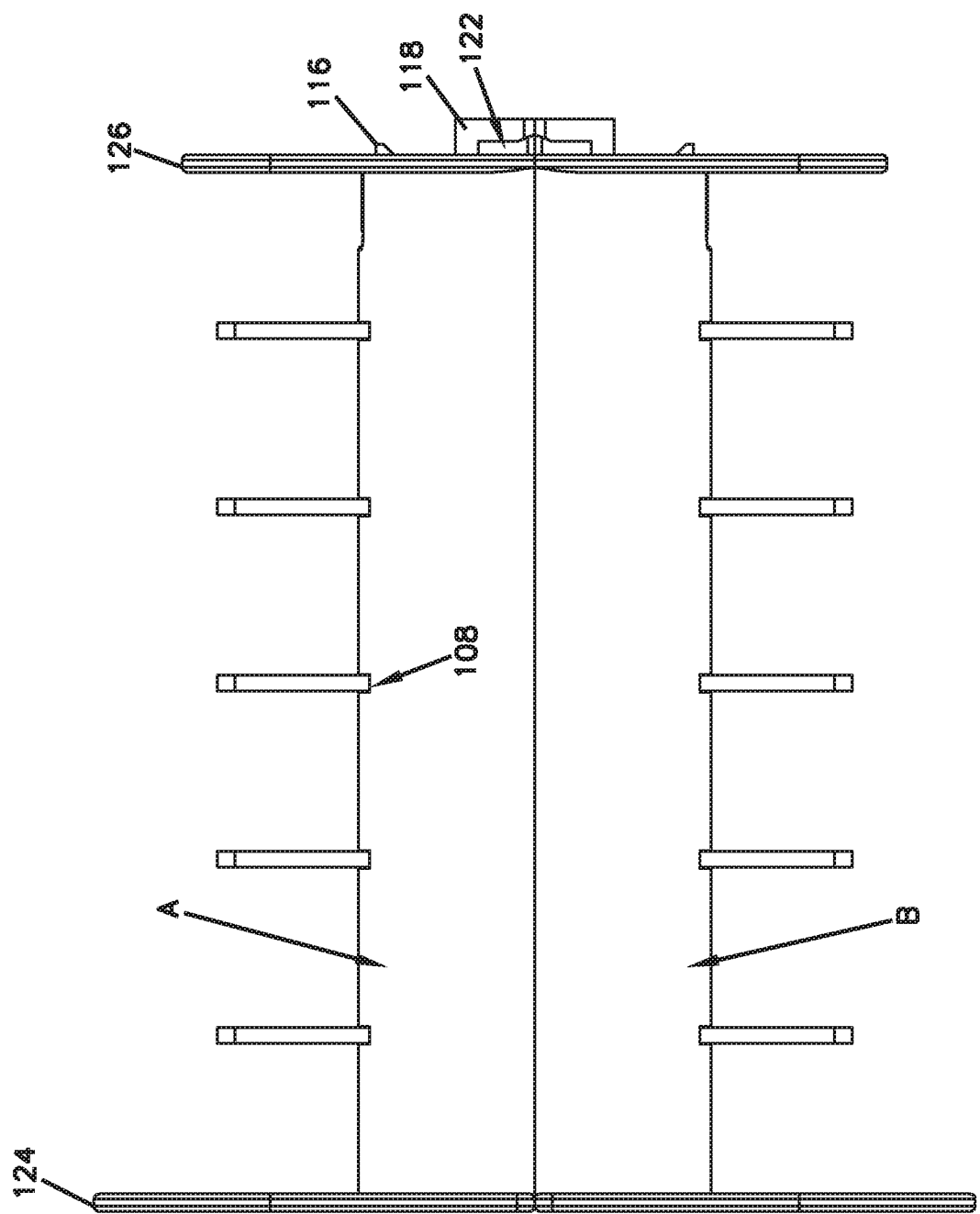
FIG. 6 is a right side view of the first cable support shown in FIG. 5, with the left side being a mirror image.
Figure 7:
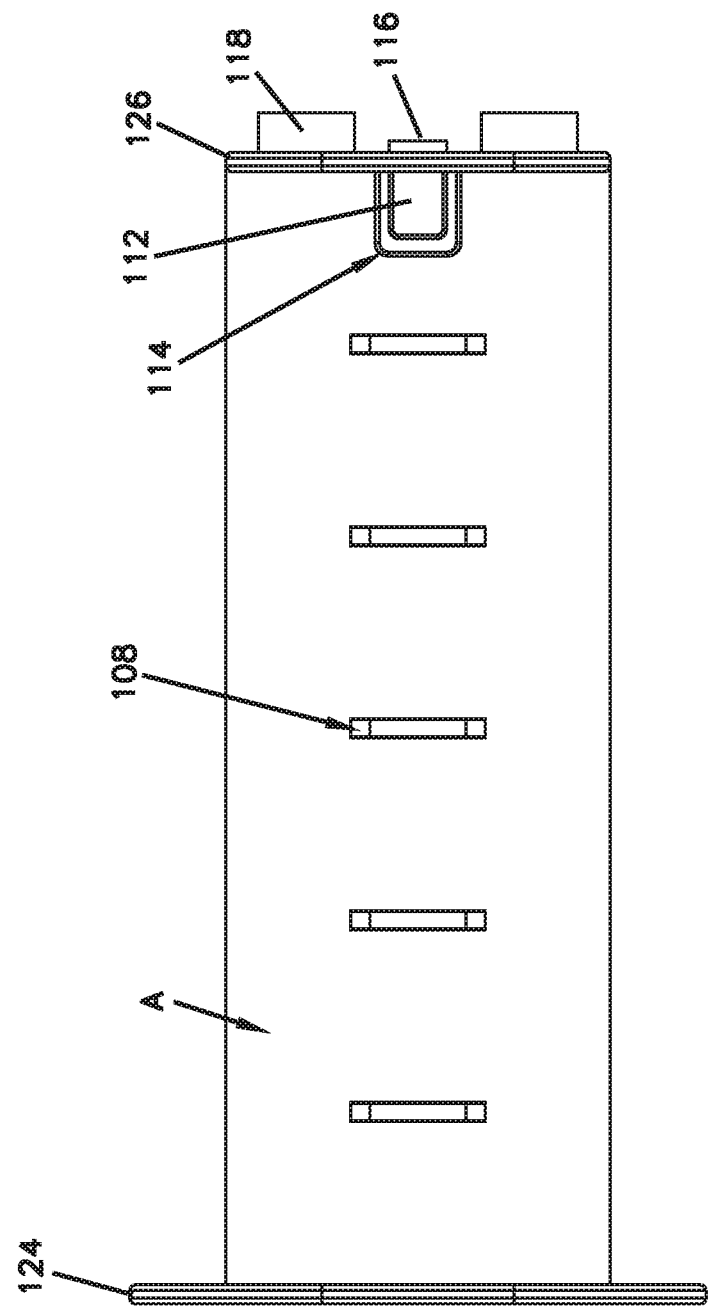
FIG. 7 is a top view of the first cable support shown in FIG. 5, with the bottom view being a mirror image.
Figure 8:
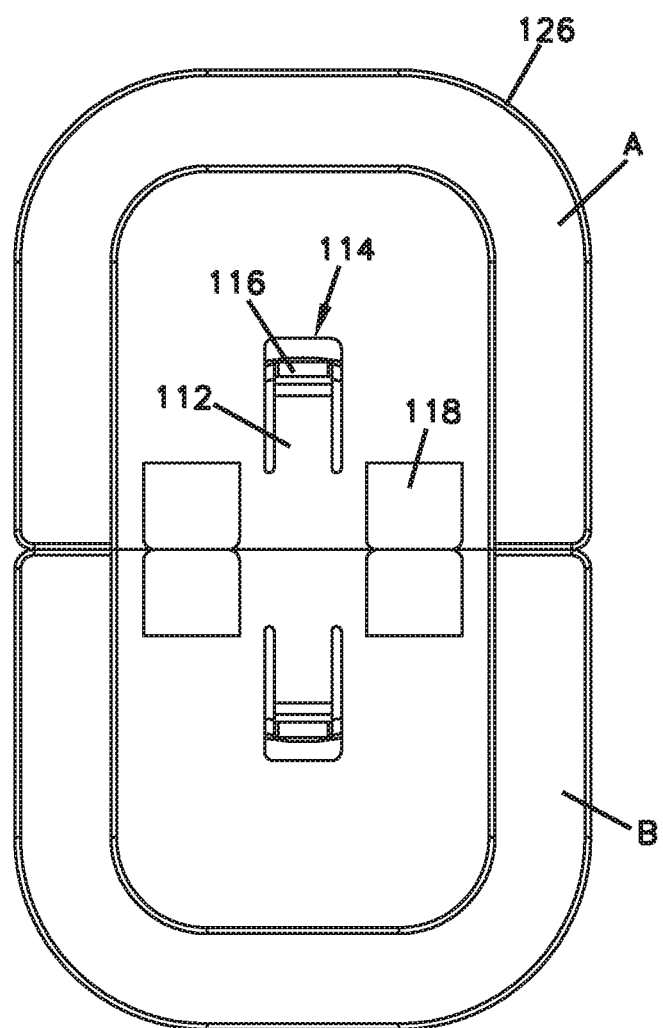
FIG. 8 is a mounting end view of the first cable support shown in FIG. 5.

In use, for example as illustrated in FIGS. 1-4, the spool 100 can be secured to the frame 12 by mounting the two spool halves A and B to the mounting receiver system 14 with the mounting system 115, as described above. The two spool halves A and B are oriented inversely to each other and aligned to form a complete spool-like geometry, for example as illustrated in FIG. 5. The two spool halves A and B can be dismounted from the frame 100 by removing the mounting system(s) 115 from the mounting receiver system 14, as described above.

The cable management system can alternatively operate with only one half of the two halves A, B described in the spool 100. For example, half A can adequately mount to the frame 12 and support cables without illustrated half B.

Figure 12:
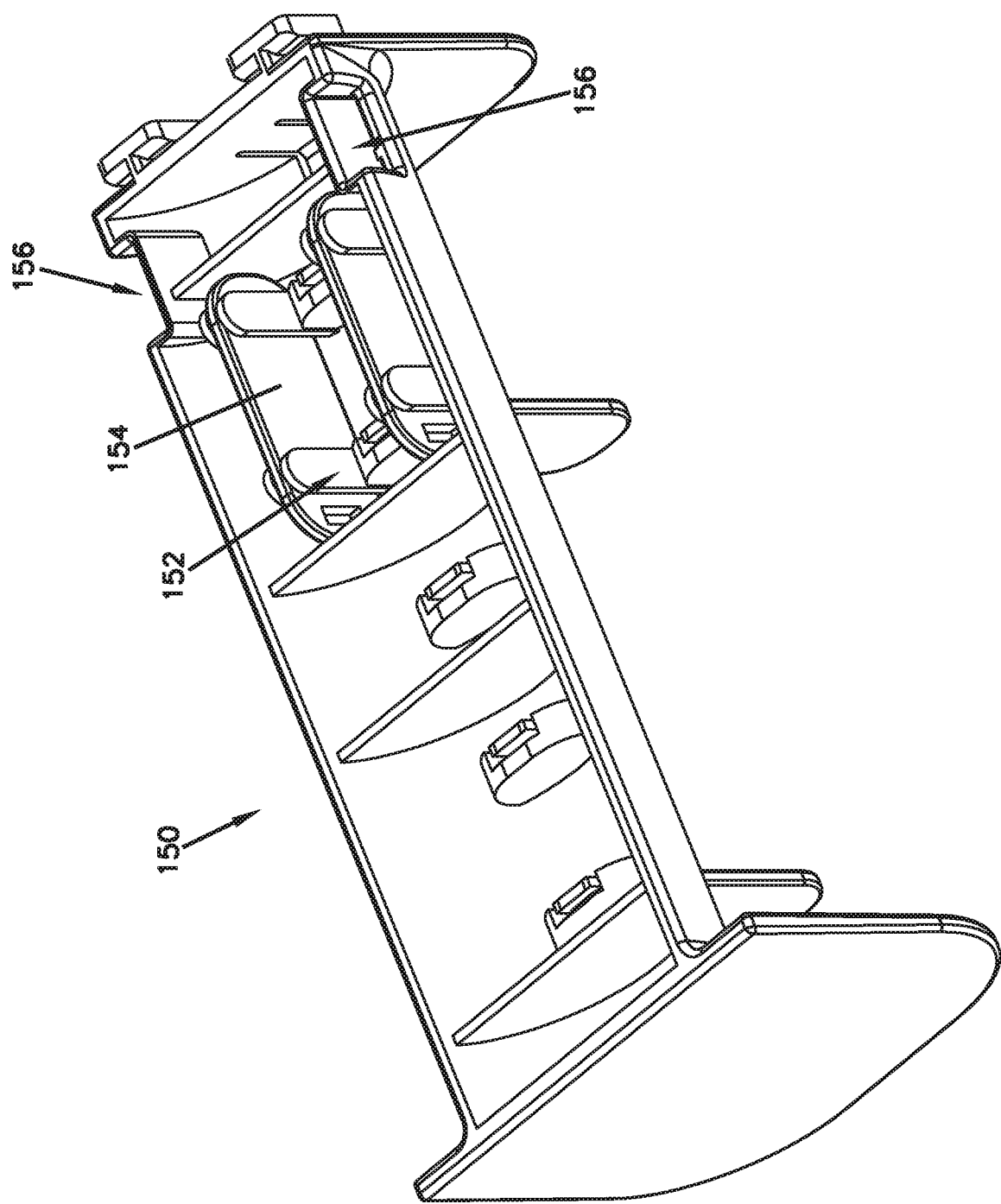
FIG. 12 is a perspective view of a top half of another example cable support, according to another embodiment of the disclosure.

FIG. 12 illustrates one half of another example spool 150. The illustrated spool 150 includes each element described above with respect to the spool 100 in FIGS. 1-11. In this regard, the illustrated spool 150 is largely identical to spool 100. Spool 150 includes additional features which can also be incorporated into, and used with spool 100. For example, the illustrated spool 150 includes an internal storage feature 152 to store dividers 154 when not in use within a receiver. The illustrated internal storage feature 152 is located within the carrier body and can be constructed of a pair of parallel fingers which support the divider 154. The illustrated spool 150 also includes a pair of opposing shoulders 156 which a user grips onto when mounting the spool onto the frame 12. The illustrated shoulders 156 can be depressions within the carrier body.

Figure 13:
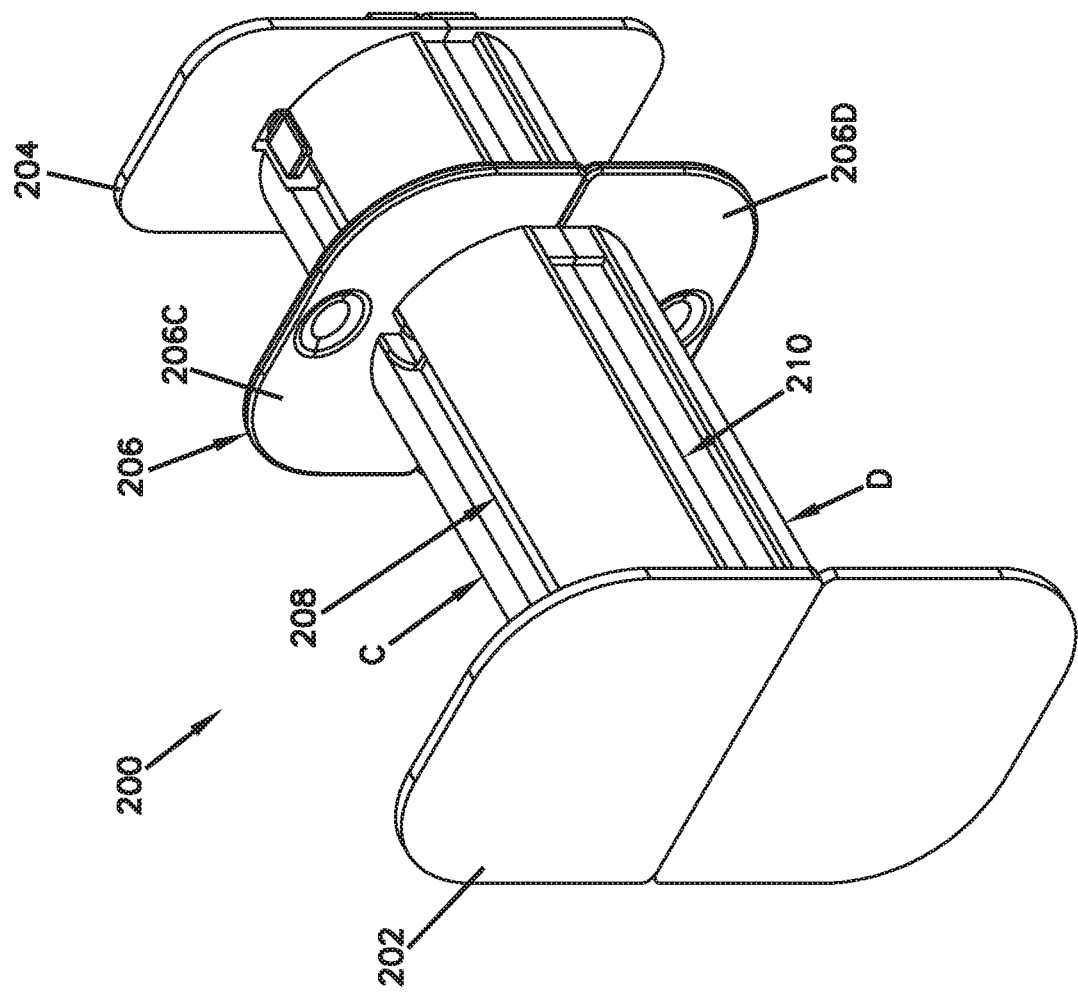
FIG. 13 is a perspective view of a second cable support shown in FIG. 1.
Figure 14:
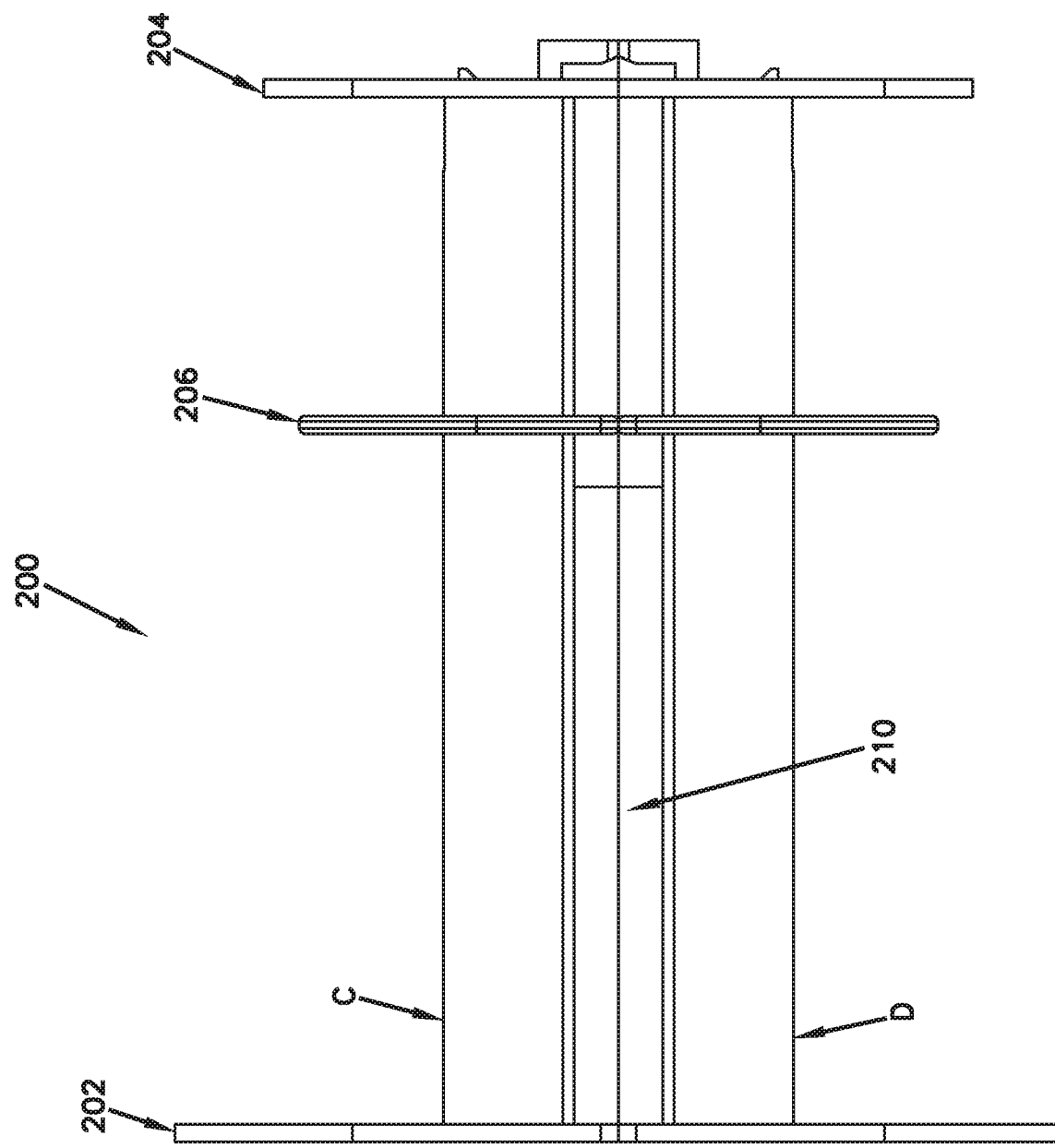
FIG. 14 is a right side view of the first cable support shown in FIG. 13, with the left side being a mirror image.
Figure 15:
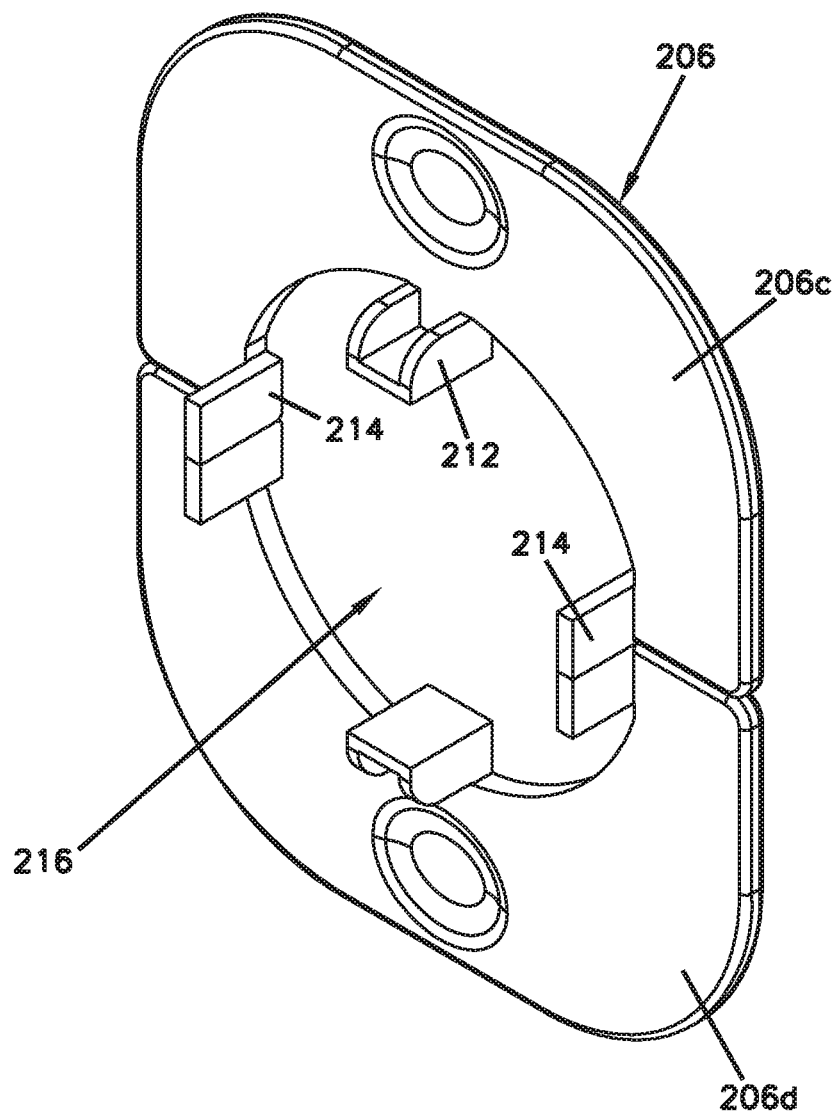
FIG. 15 is a perspective view of a partition shown in FIG. 13, shown isolated from the second cable support.

FIGS. 13-15 illustrate the example spool 200, shown in FIG. 1, which can be mounted to the frame 12 in the same manner as described above to support at least one cable 50, which can hang over the spool as illustrated. The illustrated spool 200 is constructed of a pair of halves C and D. Preferably, halves C and D are identical. The illustrated spool 200 includes a proximal barrier 204, a distal barrier 202 and a mounting system, each functioning similarly to the embodiment described above. Preferably, the proximal barrier 204, the distal barrier 202 and the mounting system of spool 200 are identical to the embodiment described above.

The illustrated spool 200 includes an adjustment system that allows a user to adjust the utility and structure in response to cables of different dimensions or in response to a need for separating multiple cables. The illustrated adjustment system includes a guide 208 extending between the distal 202 and proximal 204 barriers. Assembled as a complete spool 200, each half C, D include an identical and opposingly-positioned guide 208 so that the spool includes a pair of first guides. The illustrated guide 208 can be recessed into the carrier body.

The illustrated adjustment system also includes a track 210 positioned between the pair of opposing guides 208 on the spool 200. Preferably, the adjustment system includes a pair of tracks 210 positioned oppositely on the spool 200, for example the shown track and a track (unshown) on the opposing side of the spool, both tracks being positioned between the pair of guides 208. For example, as illustrated the pair of guides 208 can be positioned at 360° and 180°, and the pair of tracks 210 can be positioned at 90° and 270°. Each track 210 is formed by two halves, with each half C, D of the spool 200 including one half of the track. When the two halves C, D of the spool 200 are aligned, as shown in FIG. 13, a complete track 210 is formed.

The illustrated adjustment system also includes a partition 206 which adjusts to infinite positions along the guide(s) 208 and track(s) 210. The partition 206 can be formed of two identical halves 206c, 206d which combine around the carrier body of the spool 200. Each half 206c, 206d of the partition 206 includes a first follower 212 that adjusts to infinite positions within the guide 208. Each half 206c, 206d also includes a pair of second followers 214 which adjust to infinite positions within the track 210. When the partition is assembled 206, as illustrated in FIG. 14, the adjacent second followers 214 of the partition halves 206c, 206d form a combined second follower that operably fits within the track 210.

Each partition half 206c, 206c can adjust its position within the guide 208 and track 210 independently of the other. As a result, the cable management system can alternatively operate with only one half of the two halves C, D described in the spool 200. For example, half C can adequately mount to the frame 12, adjust partition half 206c and support cables without illustrated half D and partition half 206d.

Figure 16:
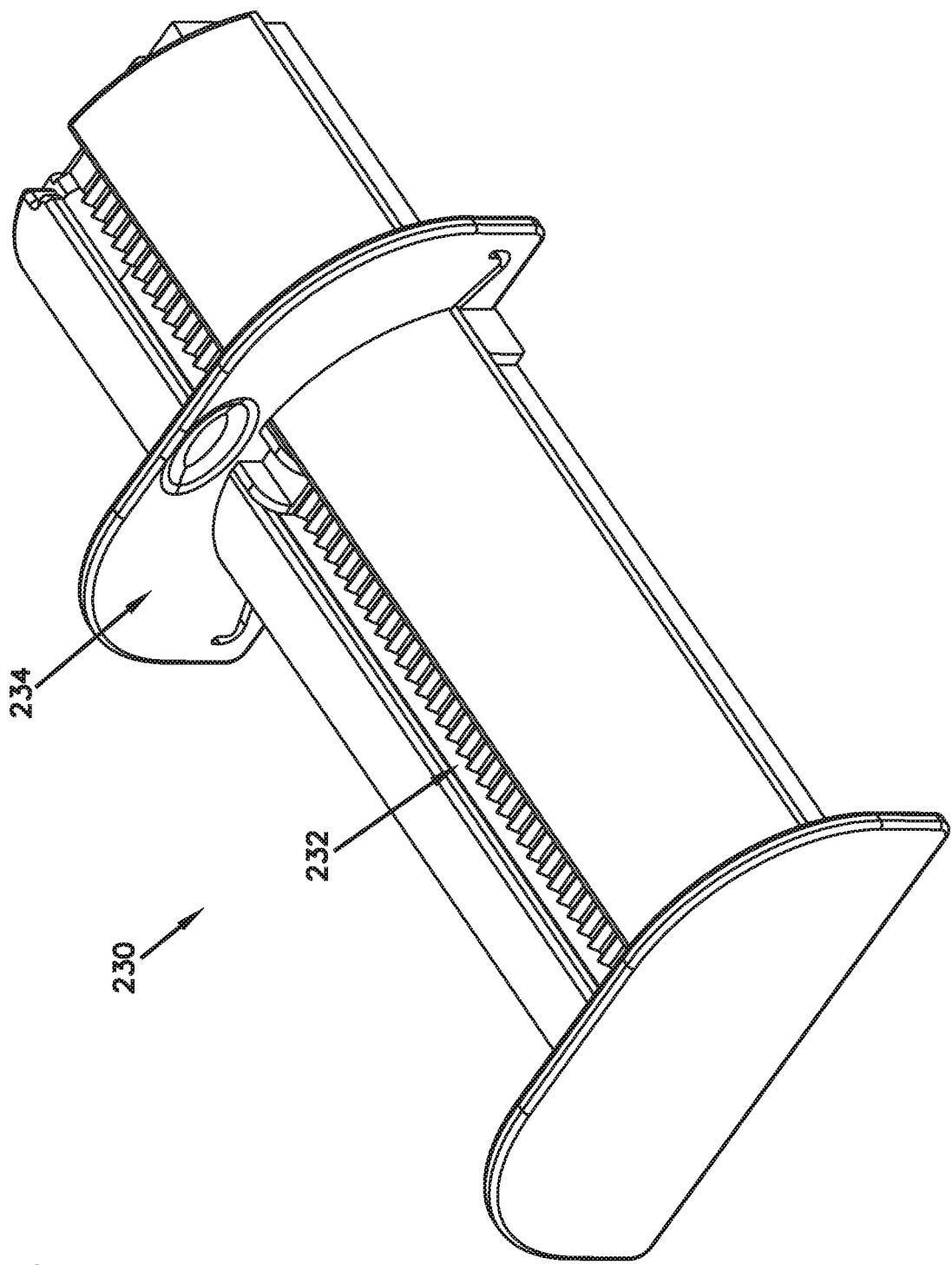
FIG. 16 is an upper perspective view of half of another example cable support, according to another embodiment of the disclosure.

FIG. 16 illustrates one half of another example spool 230. The illustrated spool 230 has a substantially similar structure and mechanical operation to the spools described above, for example spool 200. For example, the illustrated spool 230 includes a guide 232 and tracks which are positioned similarly to and function similarly to the guide 208 and track 210 described above. The illustrated guide 232 includes a ratcheting surface defining a plurality of peaks and valleys extending between the mounting end and the free end.

Figure 17:
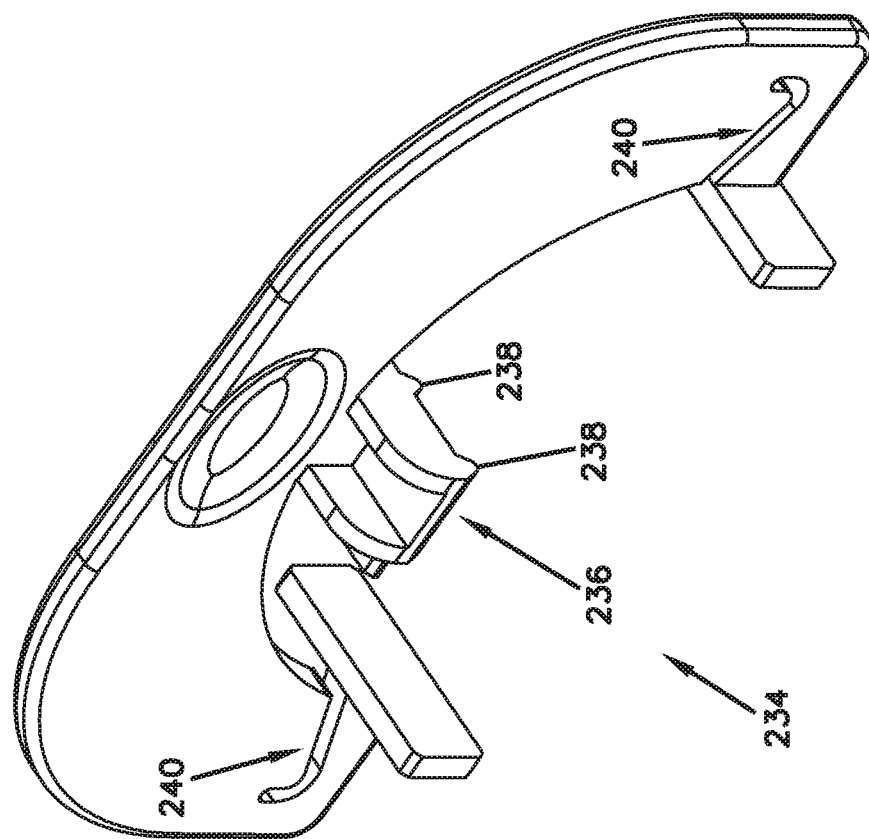
FIG. 17 is an upper perspective view of the partition shown in FIG. 16, shown isolated from the cable support.
Figure 18:
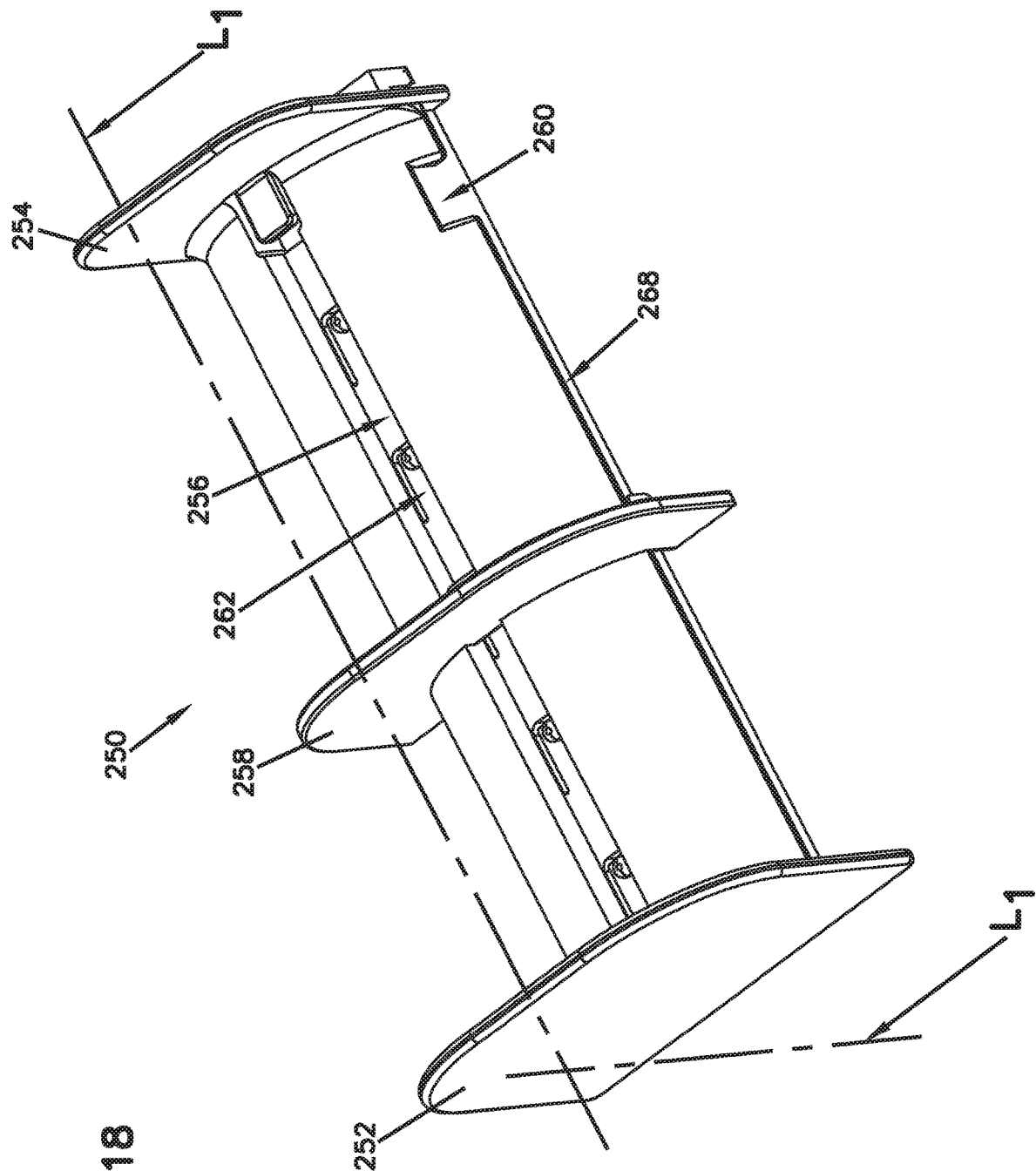
FIG. 18 is an upper perspective view of half of another example cable support, according to another embodiment of the disclosure.
Figure 19:
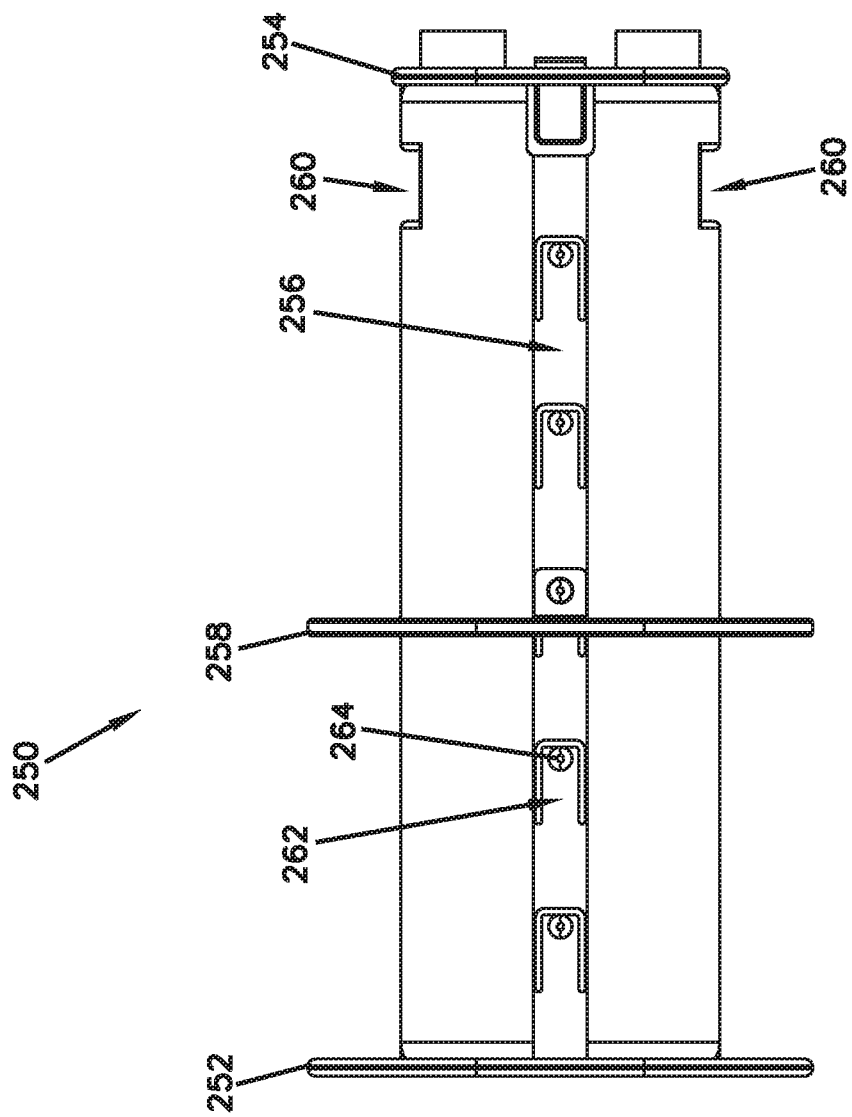
FIG. 19 is a top view of the cable support shown in FIG. 18.

FIGS. 16-17 illustrate half of another partition 234 which functions similarly to the partition 206c described above. For example, the illustrated partition 234 includes second followers which slide along the tracks, identically to the second followers 214 in the tracks 210 described above. The illustrated partition 234 also includes a first follower 236 which includes a plurality of teeth 238 to engage the ratcheting surface of the illustrated guide 232. In use, the illustrated partition 234 can be moved to different positions along the guide 232 by disengaging the plurality of teeth 238 from the peaks and valleys of the ratcheting surface. For example, a user can grab the upper portion of the partition 234 and pull it away from the guide 232, causing flexing elements 240, illustrated as curved or hook-shaped channels creating a separation in the partition, to separate or widen and allow the teeth 238 on the follower 236 to disengage from the guide. The plurality of teeth 238 are then re-engaged with the peaks and valleys at another location along the guide 232 by releasing the partition 234 and allowing the flexing elements 240 to reflexively return to an at rest condition.

FIGS. 18-21 illustrate one half of another example spool 250. Similarly to the embodiments described above, the illustrated spool 250 includes a carrier body extending between a distal barrier 252 and a proximal barrier 254. The illustrated spool 250 also includes a mounting mechanism similar in structure and operation to the embodiment described above. The illustrated spool 250 also includes opposing shoulders 260, similar to the opposing shoulders 156 described above. The illustrated spool 250 also has an adjustment mechanism that includes opposing tracks 268 similar in structure and operation to the tracks 210 described above. The adjustment mechanism of the illustrated spool 250 includes a guide 256 that includes a plurality of stoppers 262 positioned between the distal 252 and proximal 254 barriers. The stoppers 262 can be spaced evenly or unevenly with respect to each other. The adjustment mechanism also includes a partition 258 which adjusts position between the plurality of stoppers 262. The partition 258 adjusts position and fixes along the guide 256 on top of one of the stoppers 262.

The partition 258 includes a first follower that adjusts along the guide 256. This first follower has a substantially similar structure to the first follower 212 described in the embodiment above, but this first follower additionally includes a receiver 266, for example an aperture or cup. The partition 258 also includes a pair of opposing second followers which have a structure and function similar to the second followers 214 described in the embodiment above. These opposing second followers adjust within and along the track 268 similar to the second followers 214 and the track 210 described in the embodiment above.

Each stopper 262 can include an insert 264, for example a protrusion or bump that extends upwardly away from the guide 256. The insert 264 enters the receiver 266 in the first follower of the partition 258 when the partition is adjusted into position over a particular stopper 262. When the insert 264 is positioned within the receiver 266, the partition 258 is prevented from moving freely within the guide 256 by a natural resistive force. The insert 264 can be removed from the receiver 266 by applying an upwardly pulling force to the partition 258 away from the guide 256. The partition 258 can then be adjusted into a different position over a different stopper 262. More than one partition 258 can be operable along the guide 256 in order to provide multiple sections for cable storage.

Hinge Control System

Another technology disclosed includes a hinge control system which allows the door to be opened along different edges through rotation of a single handle. For example, a door to a cabinet that has hinges on opposite edges can be operated to swing open along the first edge or the second edge by simply operating a single handle a particular way. The door can be utilized for any variety of functions, for example storage of cables in conjunction with the cable storage cabinet referenced in FIGS. 1-19.

Figure 20:
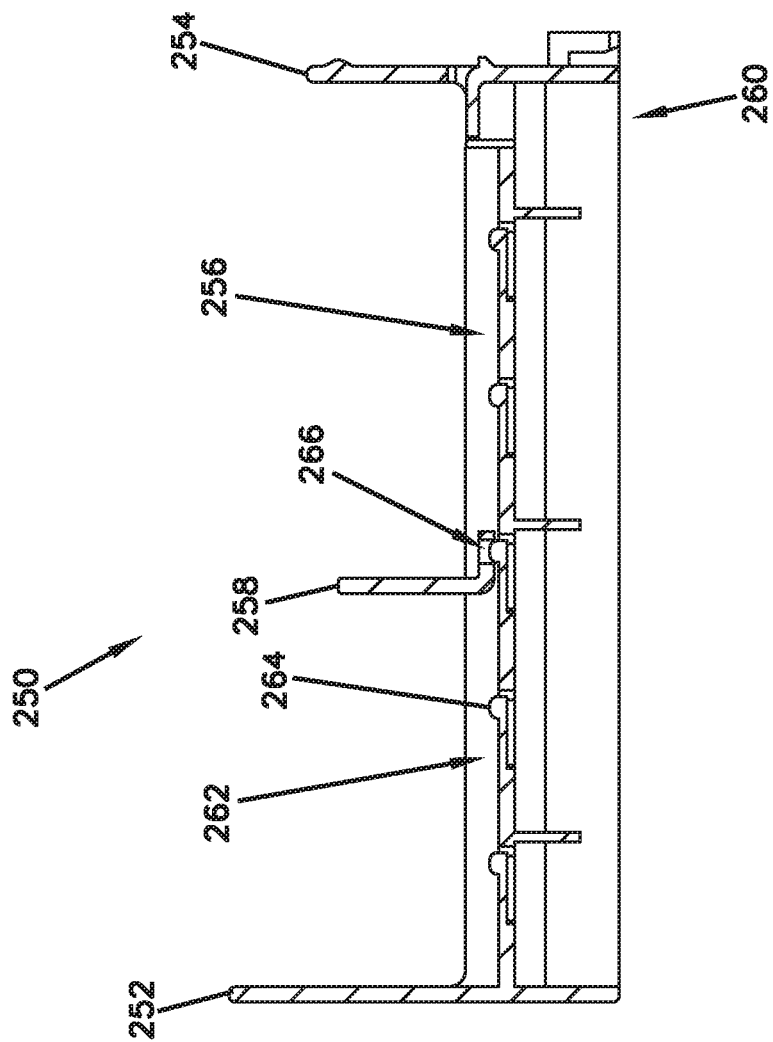
FIG. 20 is a cross-sectional view of the cable support shown in FIG. 18, as viewed along line $L_1$.
Figure 21:
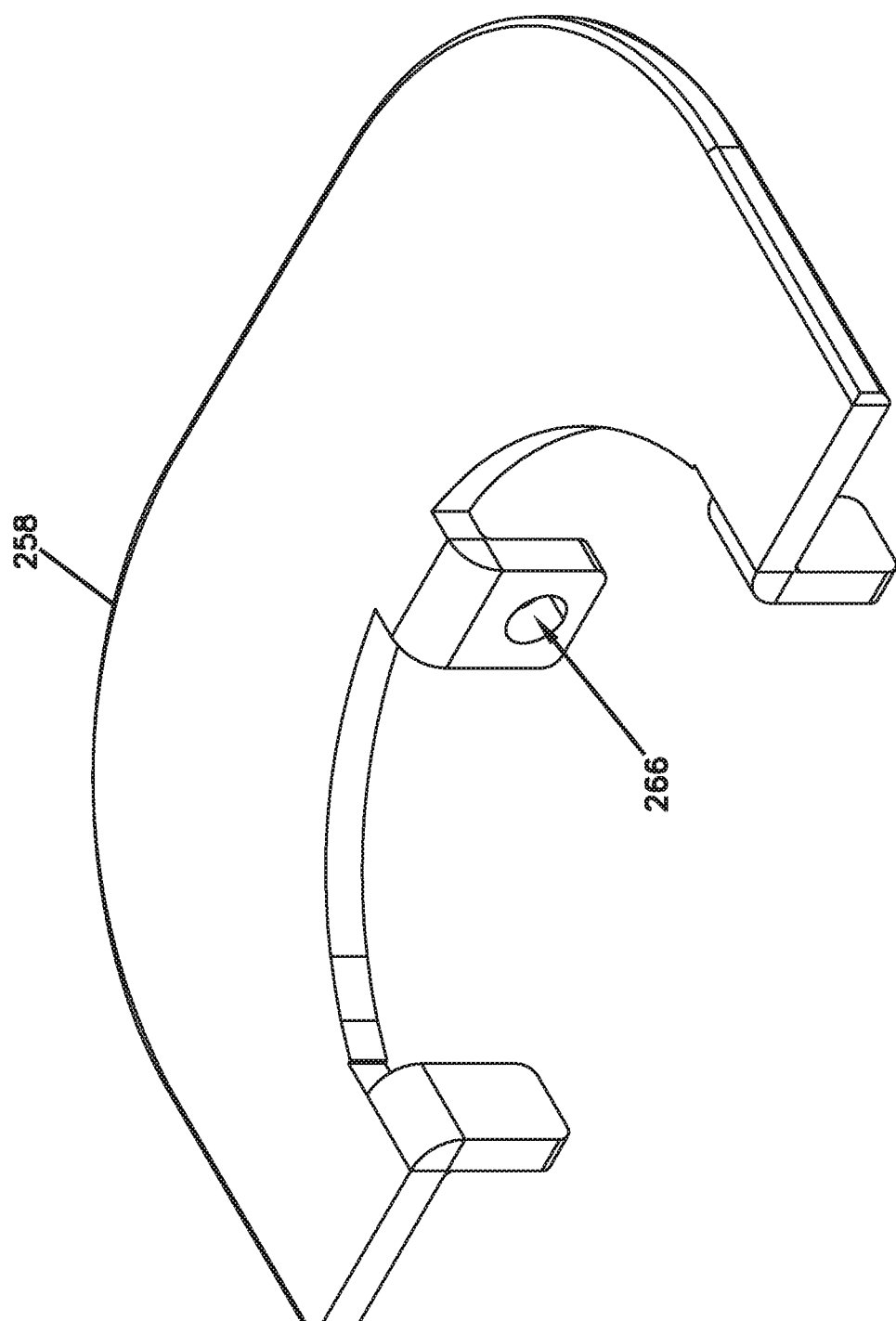
FIG. 21 is a perspective view of a partition shown in FIG. 18, shown isolated from the cable support.
Figure 22:
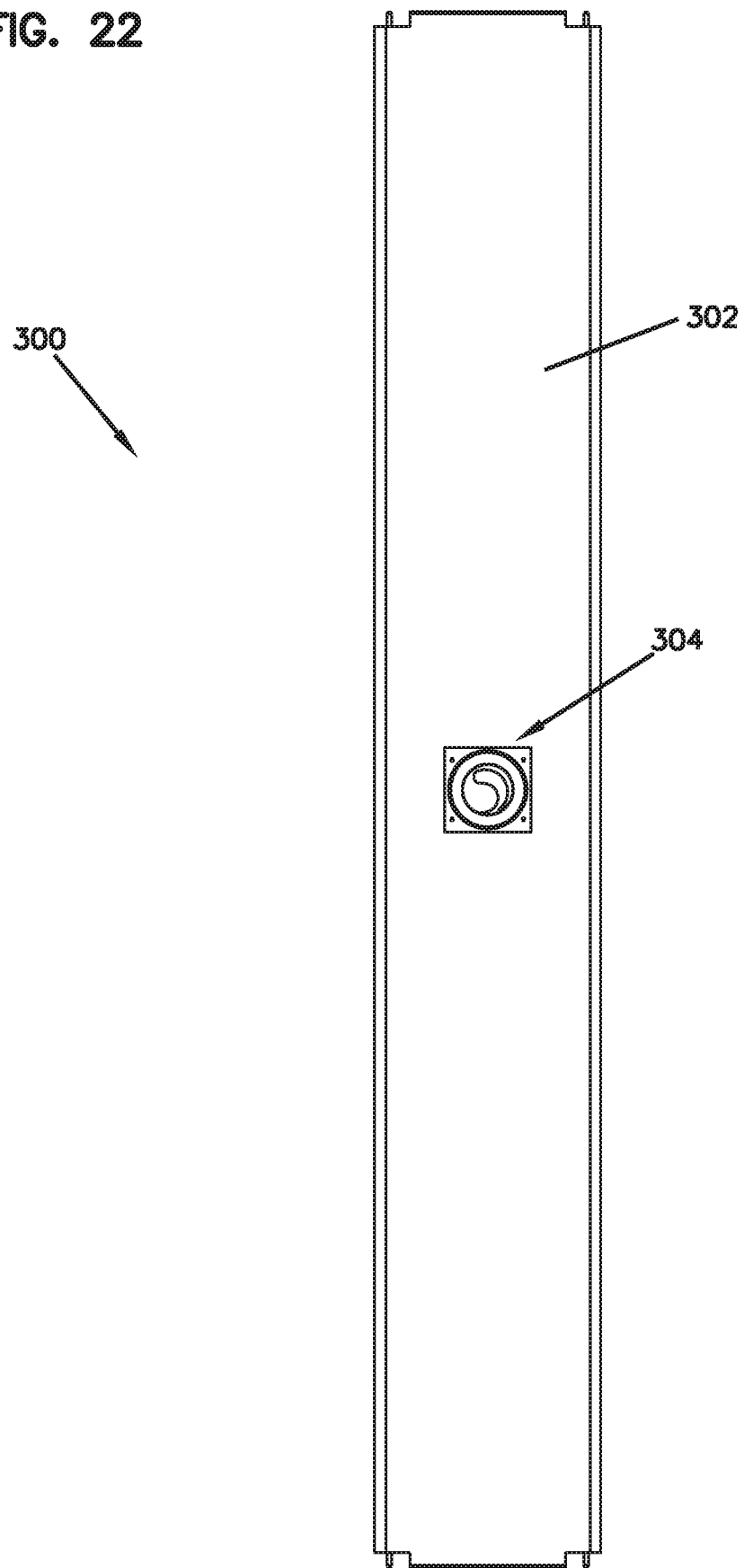
FIG. 22 is a front view of an example door and handle, according to another embodiment of the disclosure.
Figure 23:
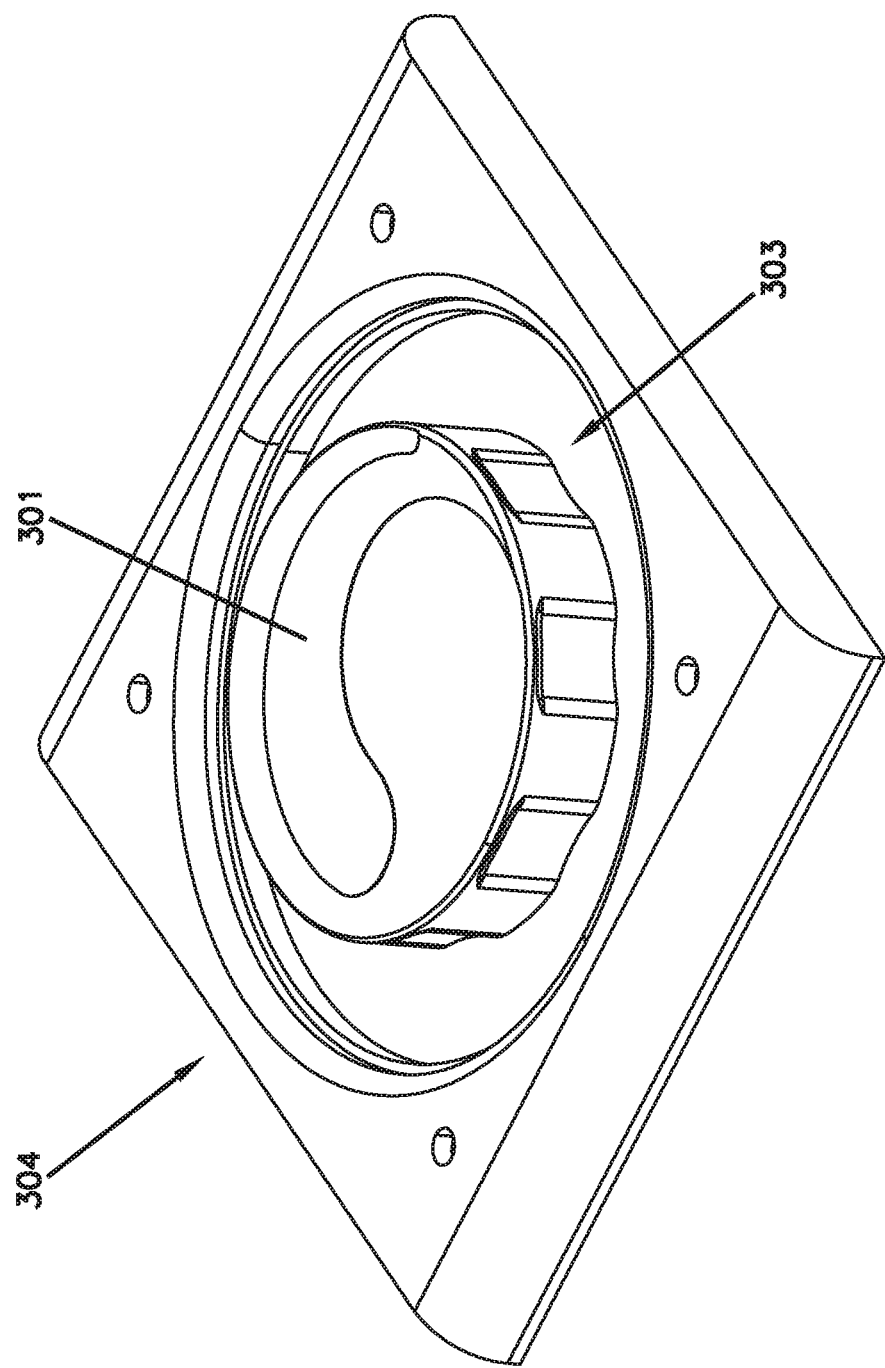
FIG. 23 is a front perspective view of the handle shown in FIG. 22, shown isolated from the door.
Figure 24:
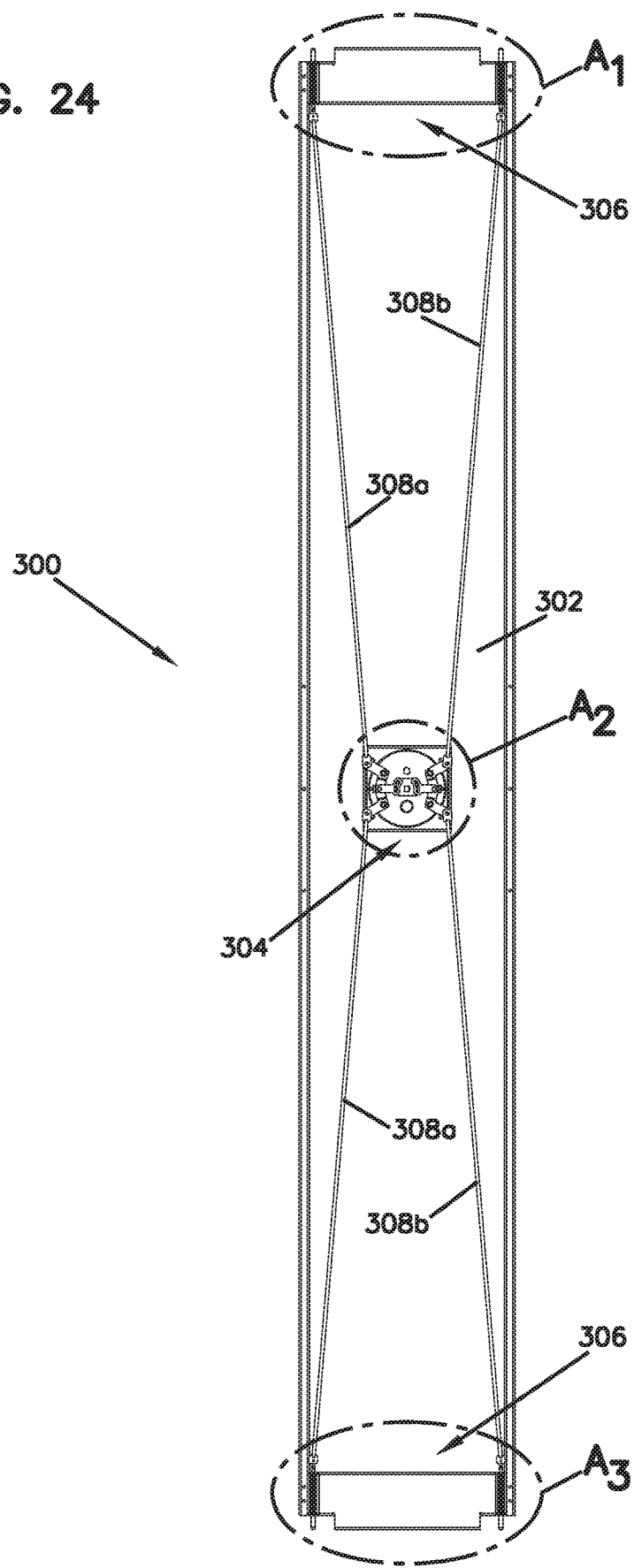
FIG. 24 is a rear view of the door and handle system shown in FIG. 22.
Figure 25:
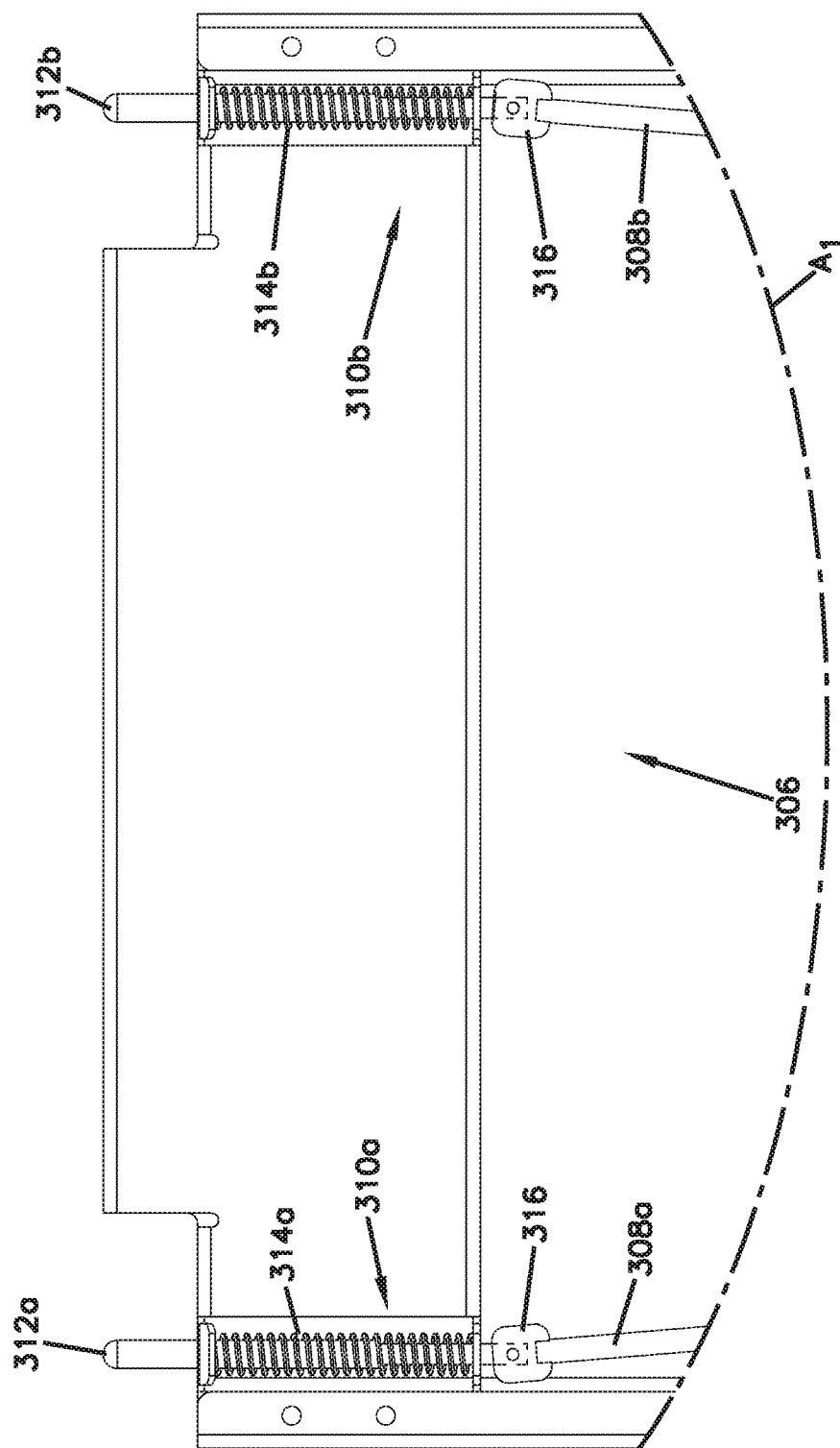
FIG. 25 is an enlarged view of window $A_1$ in FIG. 24.
Figure 26:
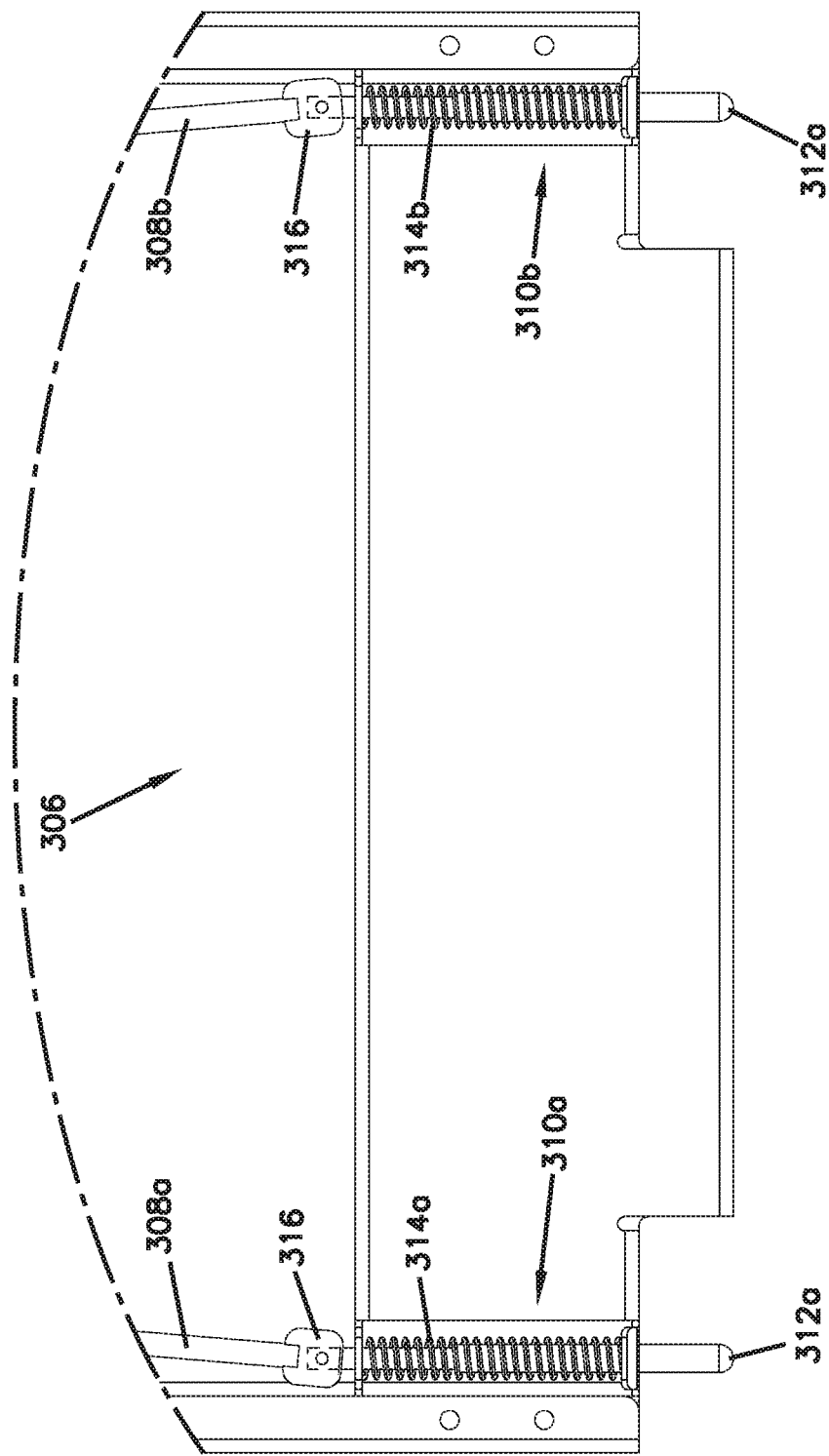
FIG. 26 is an enlarged view of window $A_3$ in FIG. 24.
Figure 27:
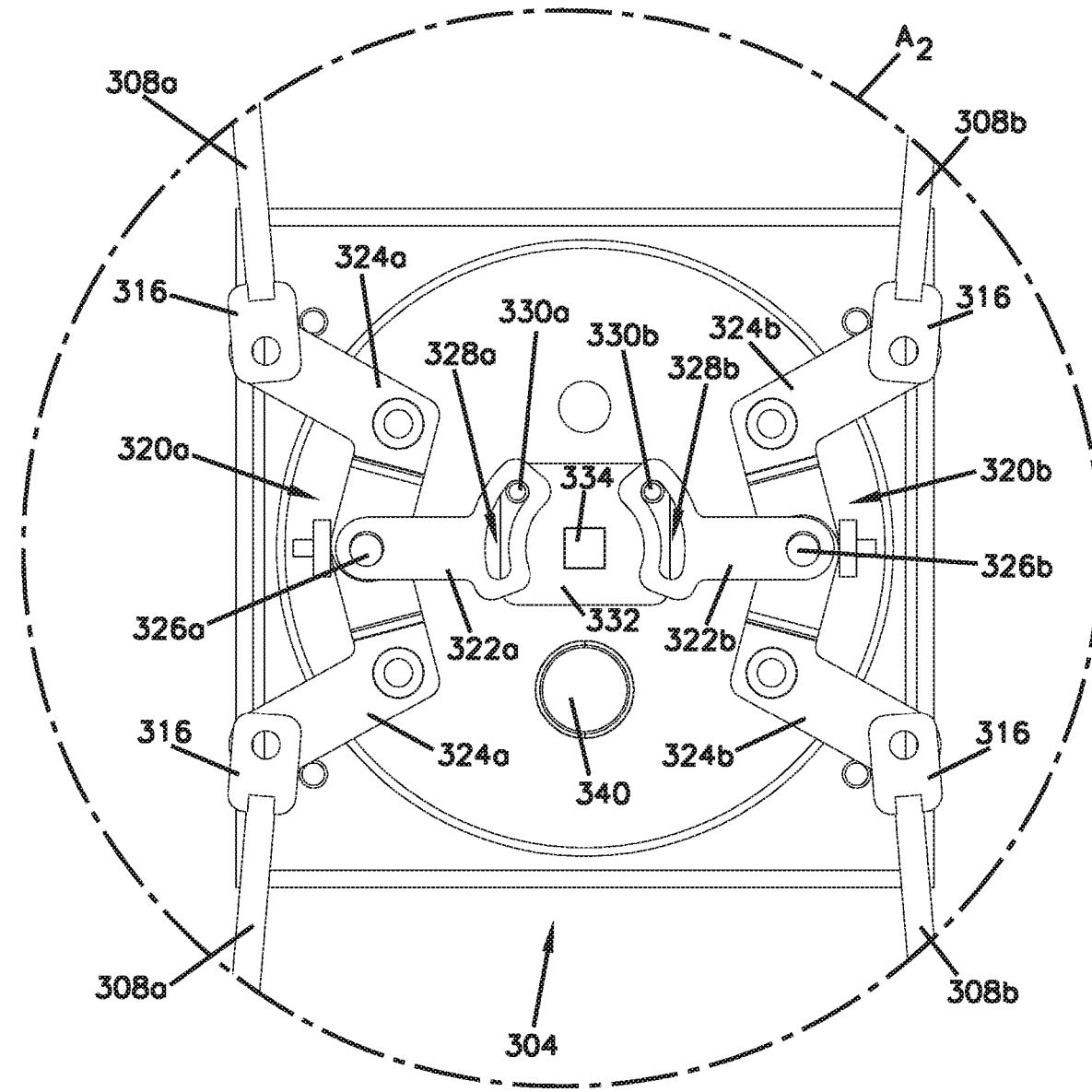
FIG. 27 is an enlarged view of window $A_2$ in FIG. 24.

FIGS. 22-30 illustrate an example hinge control system 300. The illustrated hinge control system 300 includes a handle assembly 304 which is centrally located between right, left, top and bottom edges of a door 302. FIG. 20 particularly illustrates the outer-facing front side of the handle assembly 304. The illustrated outer-facing portion of the handle assembly 304 includes a handle 301 operable within a housing 303. The illustrated handle 301 can have raised sidewalls which can be gripped by a user. When the handle 301 is gripped by a user, the handle can be rotated in either direction, left or right, within the housing 303.

FIGS. 24-27, in particular, illustrate the interior-facing side of the hinge control system 300. The illustrated hinge control system 300 includes hinge mechanisms 306 positioned with respect to the top and the bottom edges of the door 302. The illustrated top and bottom hinge mechanisms 306 are identical. Each of the top and bottom illustrated hinge mechanisms 306 include a pair of fasteners 312a, 312b and biasing elements 314a, 314b operably positioned between a base 318 and the outer perimeter of the door 302. The illustrated hinge mechanisms 306 preferably includes a pair of fasteners 312a at the first side top and bottom, a pair of fasteners 312b at the second side top and bottom, a pair of biasing elements 312a at the first side top and bottom and a pair of biasing elements 314b at the right side top and bottom. The illustrated fasteners 312a, 312b can be a pin with a mounting end and a distal free end extending out of the door 302 to removably connect to a door frame (not shown) into which the door hingedly connects.

The illustrated biasing elements 314a, 314b can be springs, such as coil springs, which engage a barrier 318. The barrier 318 can be a shelf or stopper that is rigidly secured to, and extending within, the door 302. As illustrated, the fasteners 312a, 312b extend through, and are mechanically connected to, the biasing elements 314a, 314b. The fasteners 312a, 312b are preferably mechanically connected, through means understood by persons of skill in the art, to the biasing elements 314a, 314b at a position on the biasing element distal to the barrier 318 such that transverse movement of the fastener toward the barrier will apply a compressive force to the biasing element. Conversely, the biasing elements 314a, 314b apply a resistive force against the base 318 and the fasteners 312a, 312b.

The illustrated hinge control system 300 also includes a plurality of tethers 308a, 308b extending between the handle assembly 304 and the top and bottom hinge mechanisms 306. When the tethers 308a, 308b are pulled toward the handle assembly 304, the respective fasteners 312a, 312b are drawn and the biasing elements 314a, 314b are compressed correspondingly. The illustrated tethers 308a, 308b can be elongated and rigid rods or wires which are secured to the handle assembly 304, for example through a mounting element 316, such as a mounting plate and fastener. The distal end of the tethers 308a, 308b secure to the fasteners 312a, 312b of the illustrated hinge mechanisms 306, for example through a mounting element 316 similar to mounting element used to mount the tethers to the handle assembly 304.

The illustrated handle assembly 304 includes a handle switch 332 which is mechanically connected to the handle 301 on the front-facing side of the assembly. The handle switch 332 can be mechanically secured to the handle 301 through a fastener 334, such as a bolt or screw. In use, rotating the handle 301 in either direction causes an equal and identical rotation of the handle switch 332 with respect to the handle assembly 304.

The handle switch 332 also includes a pair of followers 330a, 330b, which can be pins or inserts, rigidly positioned on either side of the fastener 334. As illustrated, one follower 330a can be positioned toward a first side of the door 302 and the other follower 330b can be positioned toward a second side of the door.

The illustrated handle assembly 304 includes a pair of cam assemblies 320a, 320b positioned on either side of the handle switch 332. The cam assemblies 320a, 320b operate with the handle switch 332 to pull one of the two pairs of tethers 308a, 308b toward each other, thus retracting a corresponding pair of fasteners 312a, 312b from a door frame (unshown).

The illustrated cam assemblies 320a, 320b each include an assembly of three arms hingedly secured to each other with a fastener 326a, 326b such as a pin. A first arm 322a, 322b in the cam assembly 320a, 320b includes a guide (or channel) 328a, 328b which receives the followers 330a, 330b on the handle switch 332. The illustrated guides 328a, 328b can be elongated and curvilinear, with the arc of the curve being identical and oriented oppositely from each other. In use, as the handle switch 332 rotates, the followers 330a, 330b are caused to travel to different positions within the guides 328a, 328b.

The illustrated cam assemblies 320a, 320b can also have a pair of pivot arms 324a, 324b which pivot toward and away from each other, similarly to the mechanics of a jaw. Each pivot arm in the pair 324a, 324b has a hinge mount end that is mounted to the fastener 326a, 326b. The pivot arms 324a, 324b also has a tether mount end that secures to a tether 308a, 308b with the above described mounting element 316. The tether mount end of the pivot arms 324a, 324b pivot or pinch toward each other, like a jaw, when actuated by the first arms 322a, 322b. Pivoting or pinching the pivot arms 324a, 324b toward each other correspondingly pulls the respective tethers 308a, 308b.

Preferably, the cam assemblies 320a, 320b operate independently from each other through rotation of the handle switch 332. For example, as particularly depicted in FIG. 28, rotating the handle switch 332 in a first direction (see arc arrow) will actuate the first cam assembly 320a to pinch the pivot arms 324a toward each other (see converging arrows), but will not actuate the second cam assembly 320b to do the same. Oppositely, as particularly shown in FIG. 29, rotating the handle switch 332 in a second direction (see arc arrow) will actuate the second cam assembly 320b to pinch the pivot arms 324b toward each other (see converging arrows), but will not actuate the first cam assembly 320a to do the same.

The handle assembly 304 can also include an anti-reversal mechanism to ensure that when the door is in the open position and hingedly secured to the door frame along only a first side, a user cannot simply turn the handle in the opposite direction, with minimal force, and accidentally release the hinged connection along the second side. In essence, the anti-reversal mechanism ensures that the door is always supported within the door frame by the hinges along at least one side.

Figure 30:
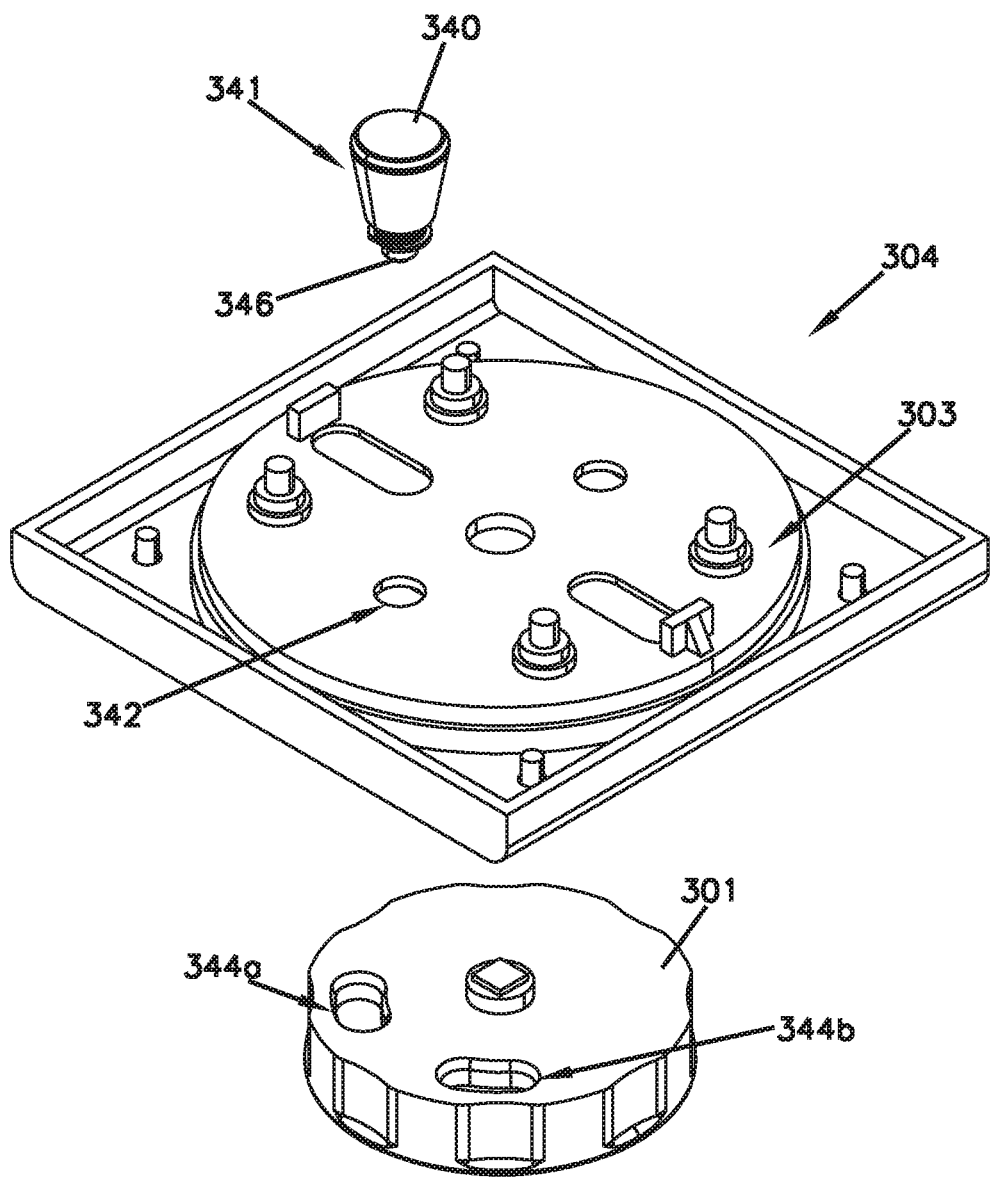
FIG. 30 is an exploded and partial perspective view of the handle system shown in FIGS. 23-24.

FIG. 30, in particular, illustrates an example anti-reversal mechanism that is mechanically operable with the handle assembly 304. The illustrated anti-reversal mechanism includes a plunger 341 with a handle 340 and a distal insert tip 346 which mountably secures through an aperture 342 extending through the housing 303. The illustrated distal insert tip 346 preferably has a chamfered geometry. The illustrated anti-reversal mechanism also includes a pair of receivers 344a, 344b set into the side (back side) of the handle 301 facing the housing 303.

The illustrated receivers 344a, 344b can be bores positioned, at rest, equidistantly from the aperture 342 in the housing 303. When the handle 301 is mounted to the housing 303, for example in FIGS. 22-23, and the door 302 is closed within the door frame (unshown) such that both sets of fasteners 312a, 312b are secured within the door frame, the plunger distal tip 346 is positioned between the pair of receivers 344a, 344b.

Figure 28:
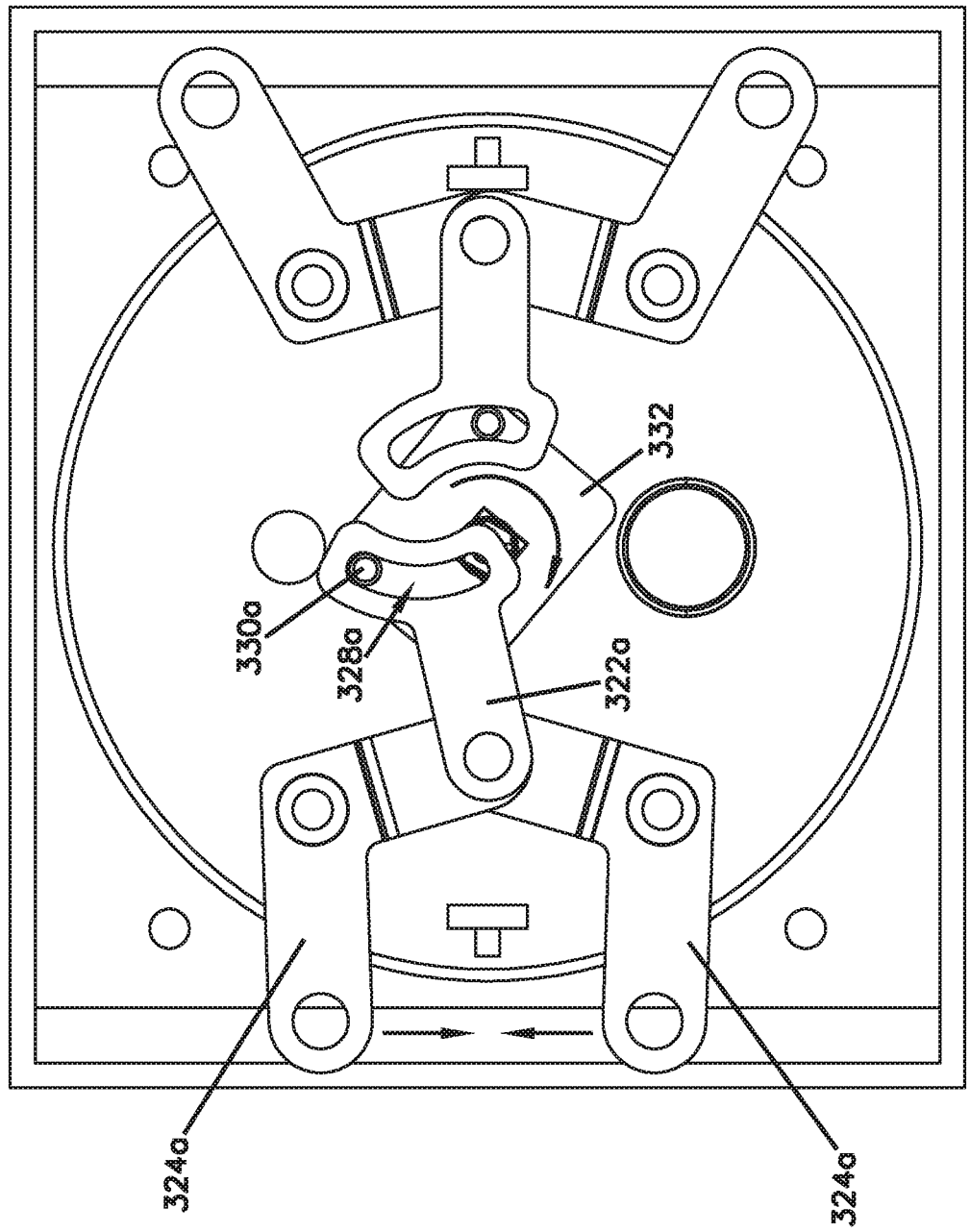
FIG. 28 is a rear isolated view of the handle system shown in FIGS. 23-24, shown with the handle rotated in a first direction.
Figure 29:
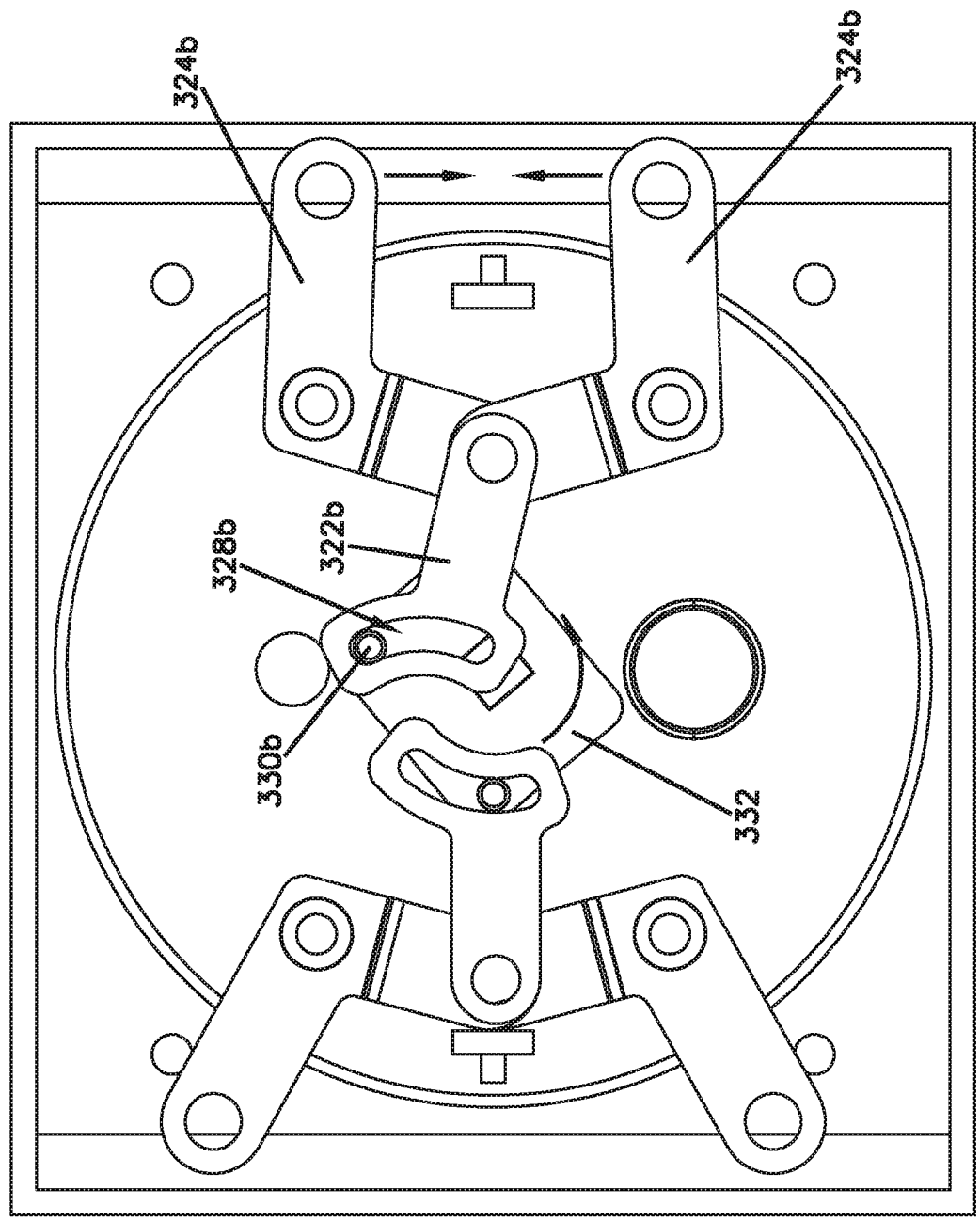
FIG. 29 is a rear isolated view of the handle system shown in FIGS. 23-24, shown with the handle rotated in a second direction.

When the handle 301 is rotated with respect to the housing 303, for example in FIGS. 28 and 29, one of the receivers 344a, 344b is equally rotated into alignment with the plunger distal tip insert 346 extending through the aperture 342. When the plunger distal tip insert 346 is positioned within one of the receivers 344a, 344b, the handle 301 is prevented from being rotated, with minimal force (torque), in an opposite direction from which it has already been rotated.

The plunger 341 is then released from the above-described locked position by rotating the handle 301 in the opposing direction with a greater amount of force (torque) such that the chamfered edge of the distal tip insert 346 engages the edge of the receiver 344a, 344b and is pushed out onto the original at-rest position. The handle 310 is then ready to be rotated in either direction again.

FIGS. 30A-30D illustrate another handle system 350 intended to function within the described hinge control system 300 substantially similarly to the handle system (304) described above. The illustrated handle system 350 includes a substantially similar structure as the handle system (304) described above, including the cam assemblies (320a, 320b), plunger receiver (342) and plunger (341). Operating the illustrated handle system 350 causes substantially similar mechanical movements of the illustrated cam assemblies (320a, 320b) to the handle system (304) described above.

The illustrated handle system 350 includes a handle switch assembly 352, which similarly to the above-described handle switch (332), actuates either of the illustrated cam assemblies (320a, 320b). The illustrated handle switch assembly 352 includes a guide 354 (or track or cam), for example an opening (or channel) that extends through the main handle assembly body from the rear side to the opposite front side. The guide 354 is defined by an elongated, and preferably semi-circularly curved, geometry. As particularly shown in FIG. 30C, the guide 354 can be defined within a barrier that is a unitary part of the main handle assembly body (or base). As illustrated, this barrier defines the guide 354 between a raised inner wall 362 and a raised outer wall 360, such that the guide extends therebetween. The illustrated inner wall 362 can have a complete circular geometry, and the outer wall 360 can have a semi-circular geometry extending around a section of the inner wall. Preferably, the diameter of the outer wall 360 is greater than the diameter of the inner wall 362.

The illustrated handle switch assembly 352 also includes a pair of followers 356a, 356b which have free distal tips which extend through the guide 354, for example to project beyond the height of the inner 362 and outer 360 barriers. The followers 356a, 356b further extend through the illustrated guides (328a, 328b) of the illustrated cam assemblies (320a, 320b).

Figure 30A:
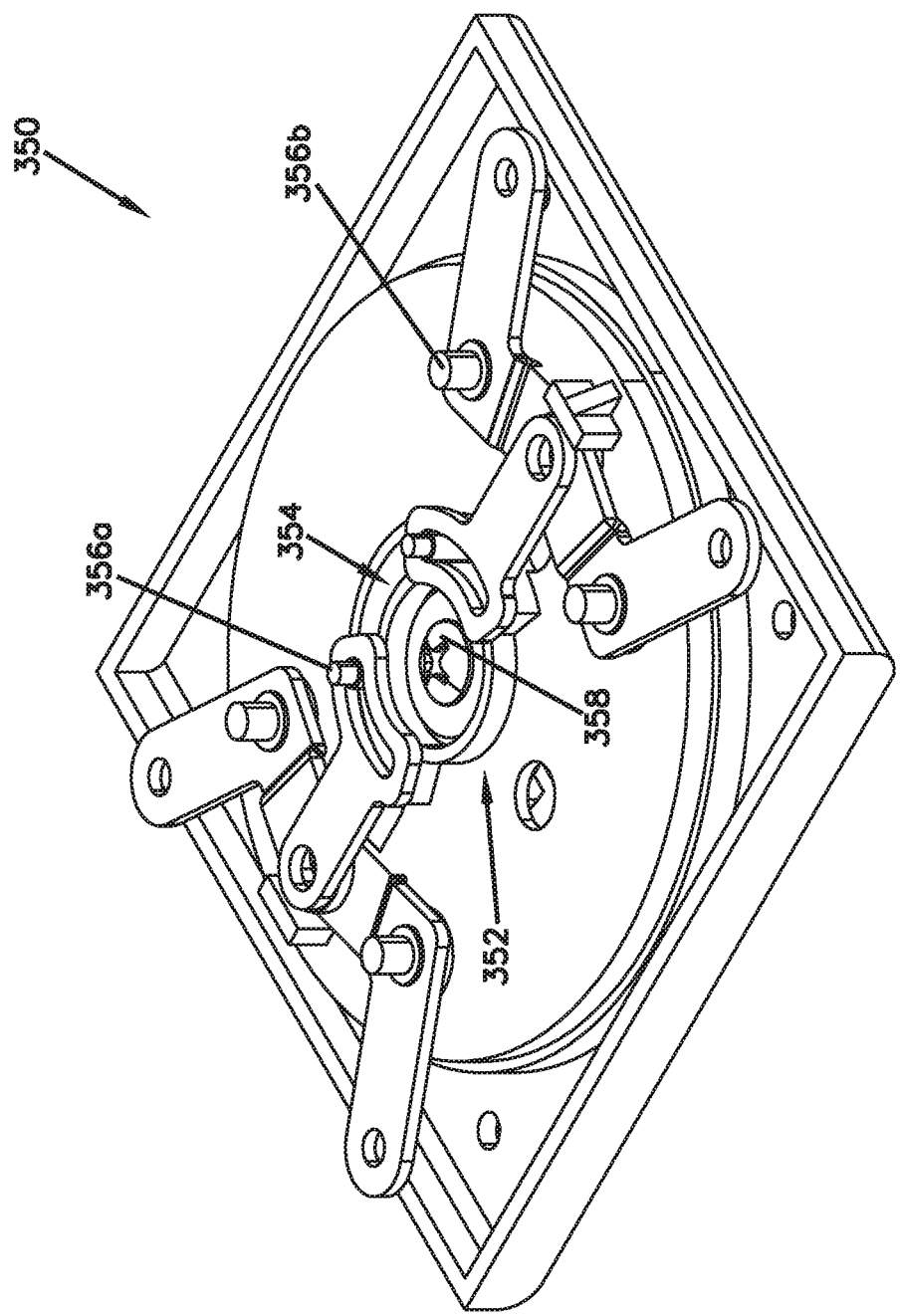
FIG. 30A is a rear perspective view of another handle assembly according to another embodiment of the disclosure, the handle assembly functioning substantially similarly to the handle assembly shown in FIGS. 22-30.
Figure 30B:
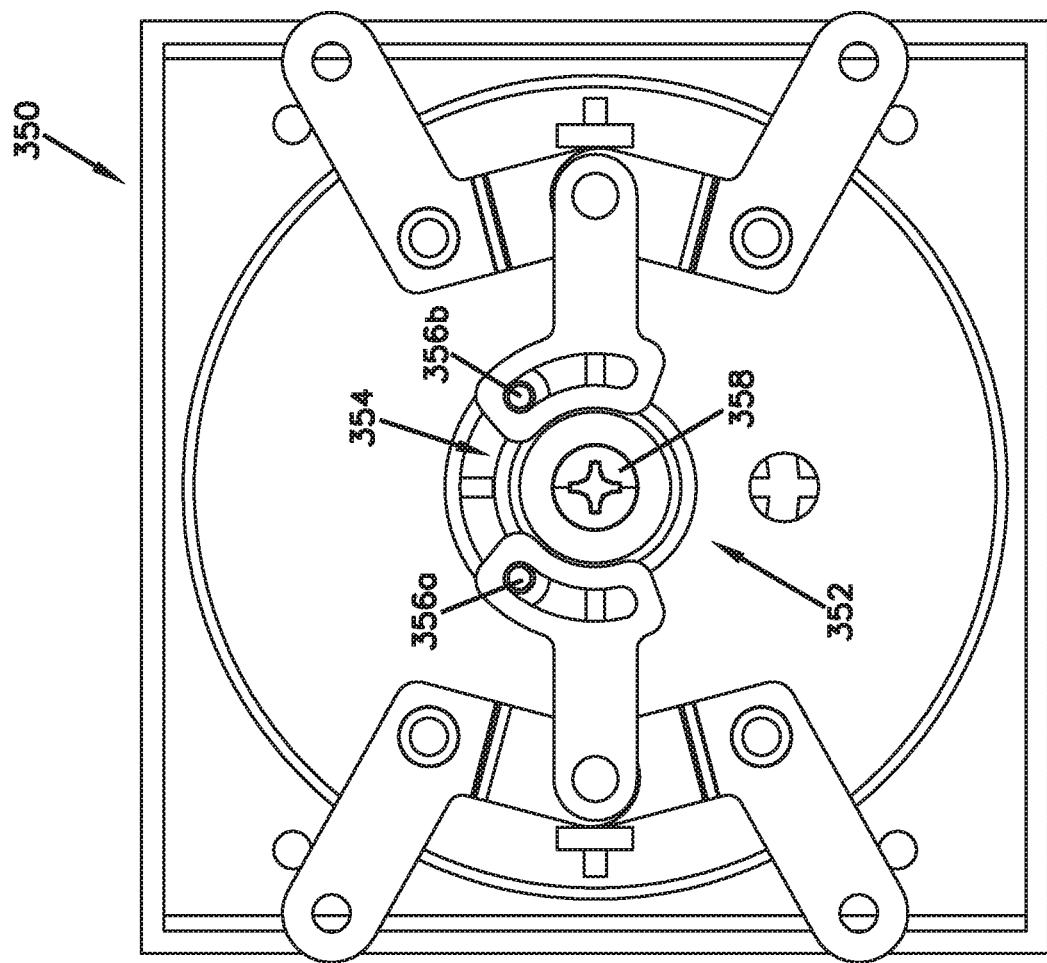
FIG. 30B is a rear view of the handle assembly shown in FIG. 30A.
Figure 30C:
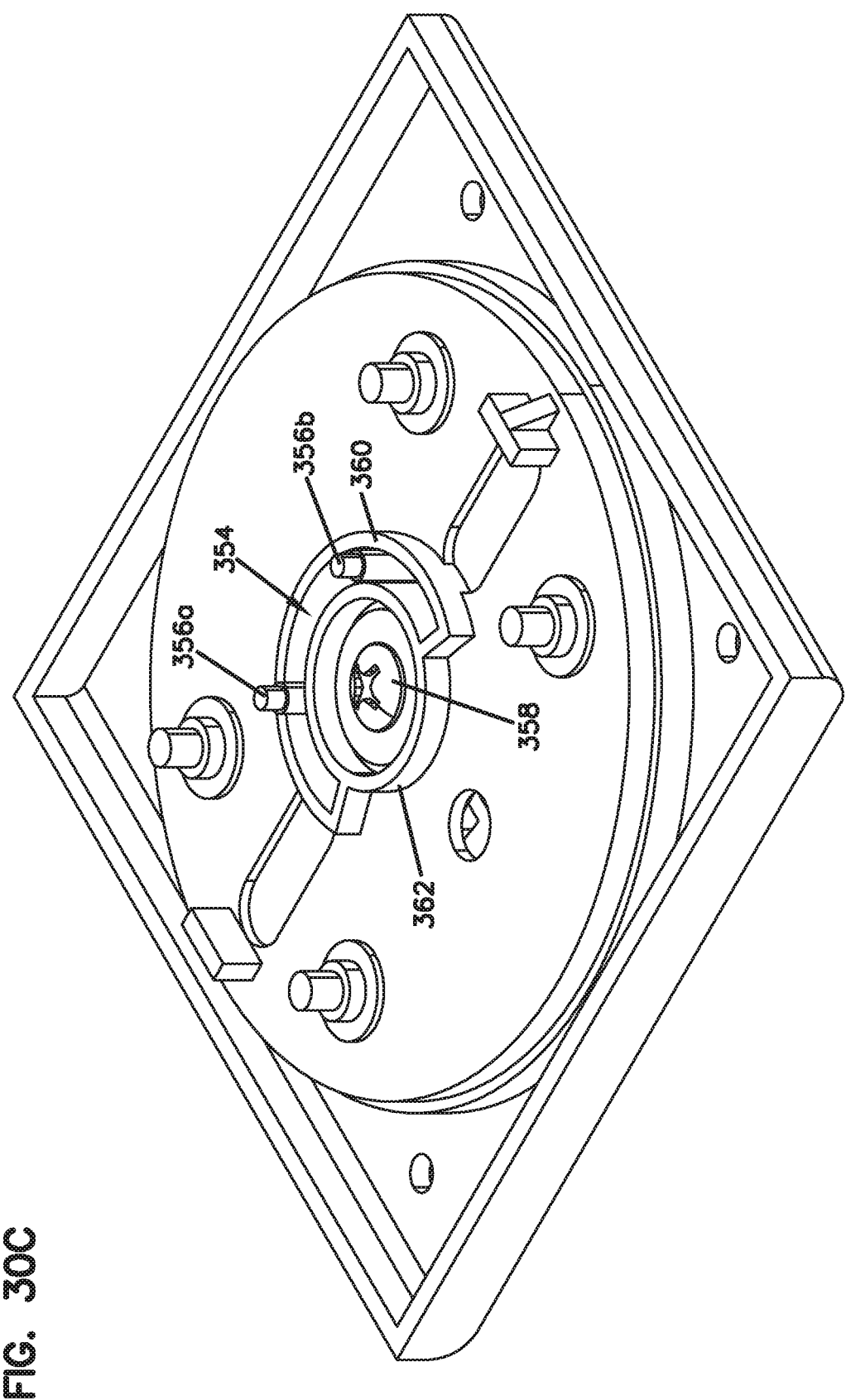
FIG. 30C is a rear perspective view of the handle assembly shown in FIG. 30A, shown without cam assemblies.
Figure 30D:
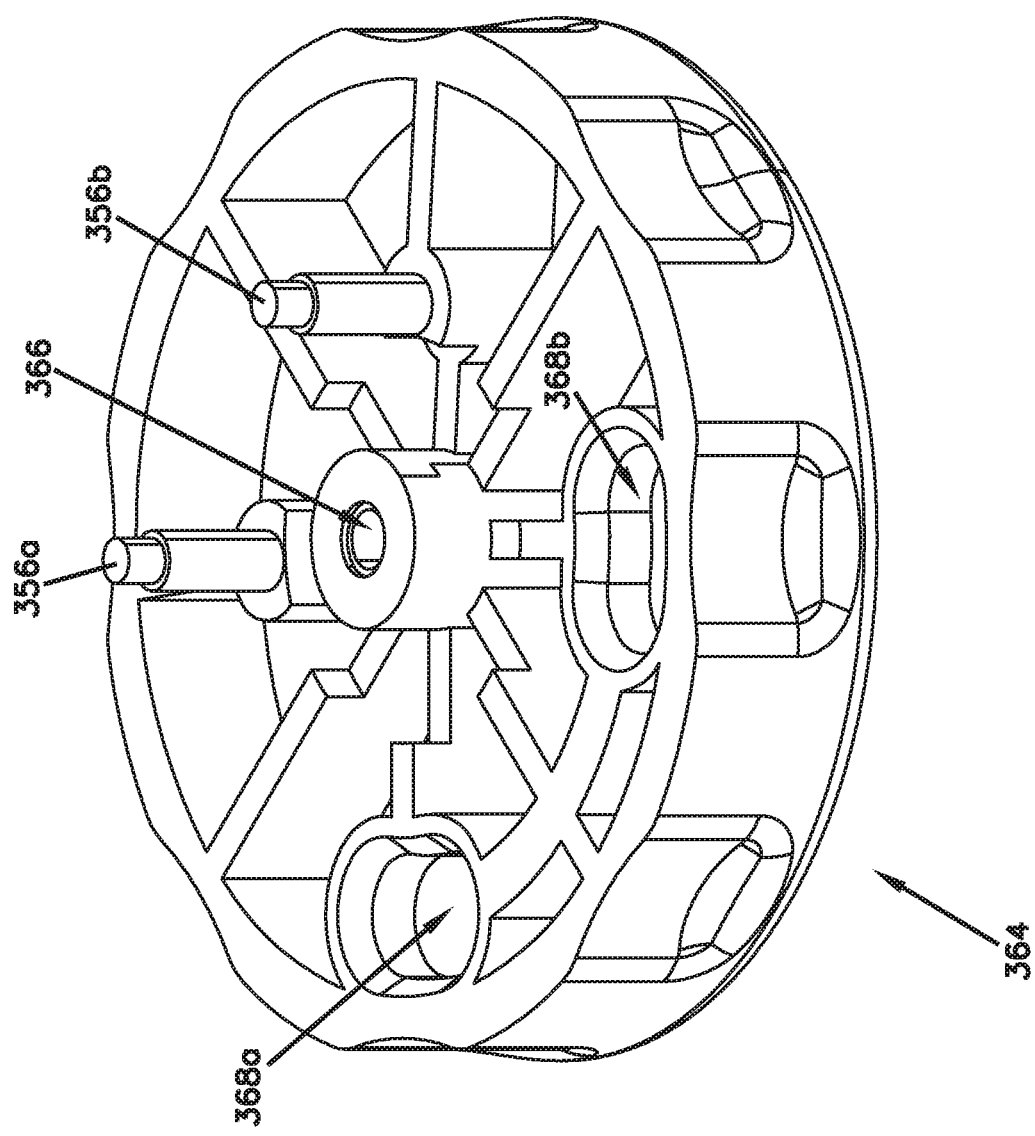
FIG. 30D is a rear perspective view of a handle isolated from the handle assembly shown in FIGS. 30A-30C.

As particularly shown in FIG. 30D, the handle assembly 350 also includes a handle 364 which is operably positioned on the opposing side of the main body substantially similarly to the handle (301) described above. The handle 364 supports the pair of followers 356a, 356b, preferably in an offset position from each other. The illustrated followers 356a, 356b extend from a fixed end at the handle body to a distal tip. Preferably, the handle 364 forms a singular construction, including the main body and the pair of followers 356a, 356b, for example through a single mold.

The illustrated handle 364 includes a fastener receiver 366 to receive a fastener 358 inserted through an aperture (not shown) in the main body of the handle assembly 350. For example, the fastener 358 can be a threaded screw and the fastener receiver 366 can be a threaded bore with a corresponding threaded pattern. An example screw can have a head portion and an elongated insertion portion. Preferably, the head of the fastener 358, as shown in FIGS. 30A-30C, is wider than the clearance of the aperture (not shown) extending through the main body of the handle assembly 350, so as to prevent the fastener from extending all the way through the aperture upon insertion.

Preferably, the aperture (not shown) in the main body of the handle assembly 350 allows the fastener 358 to rotate about an axis extending therein. For example, the aperture (not shown) can be have a smooth surface without a threaded pattern and/or the aperture can have a clearance that is wider than the width of the insertion portion of the fastener 358 so as to avoid contact or friction therebetween.

The fastener 358, upon being inserted through the aperture (not shown) secures to, or within, the fastener receiver 366 in the handle 364. Preferably, the fastener receiver 366 defines a feature, such as a threaded surface, which fastens to the insertion portion of the fastener 358. Preferably, the fastener 358 rigidly fastens to the fastener receiver 366, such that once fastened, the handle 364 rotates correspondingly with the fastener and does not rotate with respect to the fastener. As a result, when fastened, the handle 364 can be freely rotated in either direction with respect to the main body of the handle assembly 350, substantially similarly to the handle (301) described above.

In use, with the handle 364 rotatably fastened to the main body of the handle assembly 350, as described above, the pair of followers 356*a*, 356*b* extend through the guide 354 and through respective guides (328*a*, 328*b*) in the cam assemblies (320*a*, 320*b*). Rotation of the handle 364 in either the left or right direction causes actuation of the respective cam assemblies (320*a*, 320*b*), as substantially similarly described above, particularly in FIGS. 28-29.

The handle 364 also includes a pair of plunger receivers 368*a*, 368*b*, which function substantially similarly to the receivers (344*a*, 344*b*) described above to receive a plunger (341) through a respective plunger receiver. Preferably, the illustrated handle 364 defines a substantially similar outer geometry and features as the handle (301) described above.

Indicator System

Another technology disclosed includes an indicator system to alert a user to whether a door is open or closed. For example, the indicator system can be used with doors which provide access to cabinets that store industrial equipment, such as telecommunications cables and connectors. An example storage cabinet is referenced with respect to the cable storage elements illustrated in FIGS. 1-21. An example door is the door 302 introduced as an example in FIGS. 22-23. These doors are often very heavy and positioned such that determining if the door has been left open following use is difficult. The indicator system (or indicator stimulus) can include a visual (or visible) indicator which is actuated to alternate between open and closed states, with each presenting a different visual stimulus.

An example indicator system is illustrated in FIGS. 31-34. The illustrated indicator system 400 is supported by a base including a floor 402. The illustrated base can have a first end 440 and a second end 450. The base floor 402 can be secured to or part of a storage structure, for example a cabinet with a door, such as described above. Each end 440, 450 can include a complete indicator system 400, for example to be used with a storage cabinet that has a pair of opposingly-oriented doors.

Figure 32:
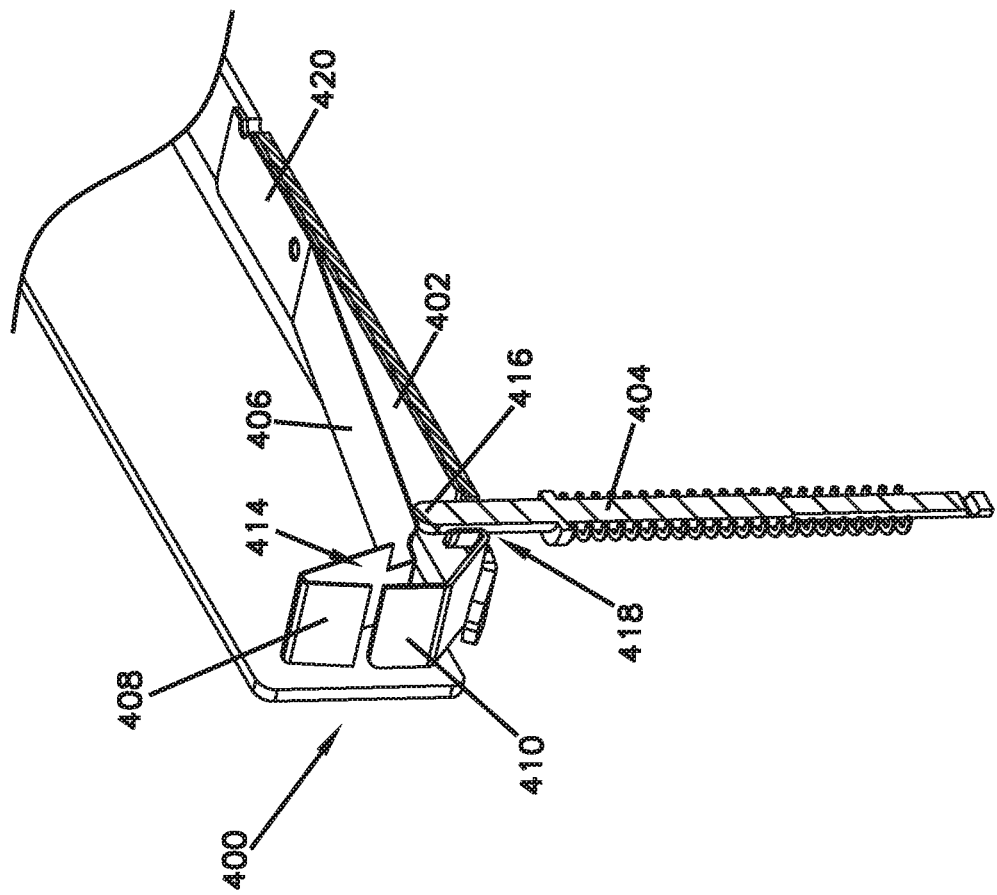
FIG. 32 is a cross sectional view of the indicator system shown in FIG. 31, as viewed along line $L_2$.

As particularly illustrated in FIG. 32, the illustrated indicator system 400 includes a first extension, for example a cover 408, and a second extension, for example visual indicator 410. The illustrated cover 408 is defined by a receiver 414 geometry. The example receiver geometry 414 can have a "V" shape with a planar outwardly-facing surface. The illustrated visual indicator 410 includes a visual stimulus which is visible to a user when removed from the cover 408, as illustrated in FIGS. 29-30. For example, the visual stimulus can include a brightly colored surface or other functionally equivalent visible element.

Figure 33:
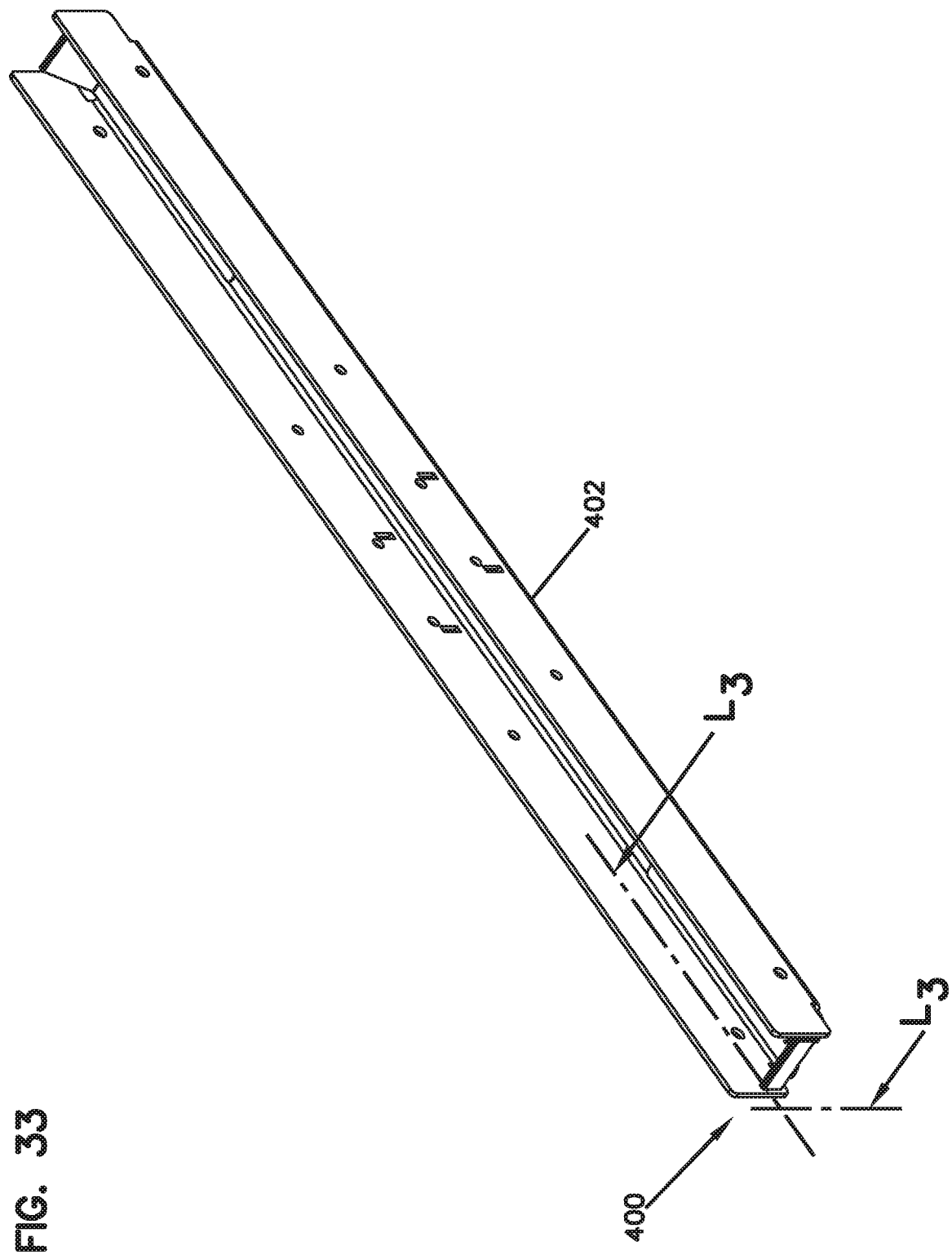
FIG. 33 is a perspective view of the indicator system shown in FIG. 31, as shown in the open position.

The illustrated cover 408 is supported at a free end of a deflection arm 406 that is mounted at a fixed end 420 to the base floor 402. When deflected away from the base 402 in a second active state, as illustrated in FIGS. 31-33, the visual indicator 410 is revealed from behind and within the cover 408. In use, when the visual indicator 410 is revealed and visible to a user, a door with which the indicator system 400 operates is closed.

The deflection arm 406 can be manipulated or deflected away from the base floor 402 by force imparted by a ram (or plunger) that is supported by a door with which the visual indicator system 400 operates. An example ram 404 is illustrated to include a distal tip 416 which engages (or contacts) the hidden or underside of the deflection arm 406 to deflect the free end of the arm upwardly away from the base floor 402, thus revealing the visual indicator 410 from within the cover 408. An example ram 400 can include a spring-mounted pin such as the hinge fasteners 312*a*, 312*b* described above. The distal tip 416 of the illustrated ram 404 can travel through an access or aperture 418 in the base floor 402 when the door is closed and the ram is aligned with the aperture.

Figure 34:
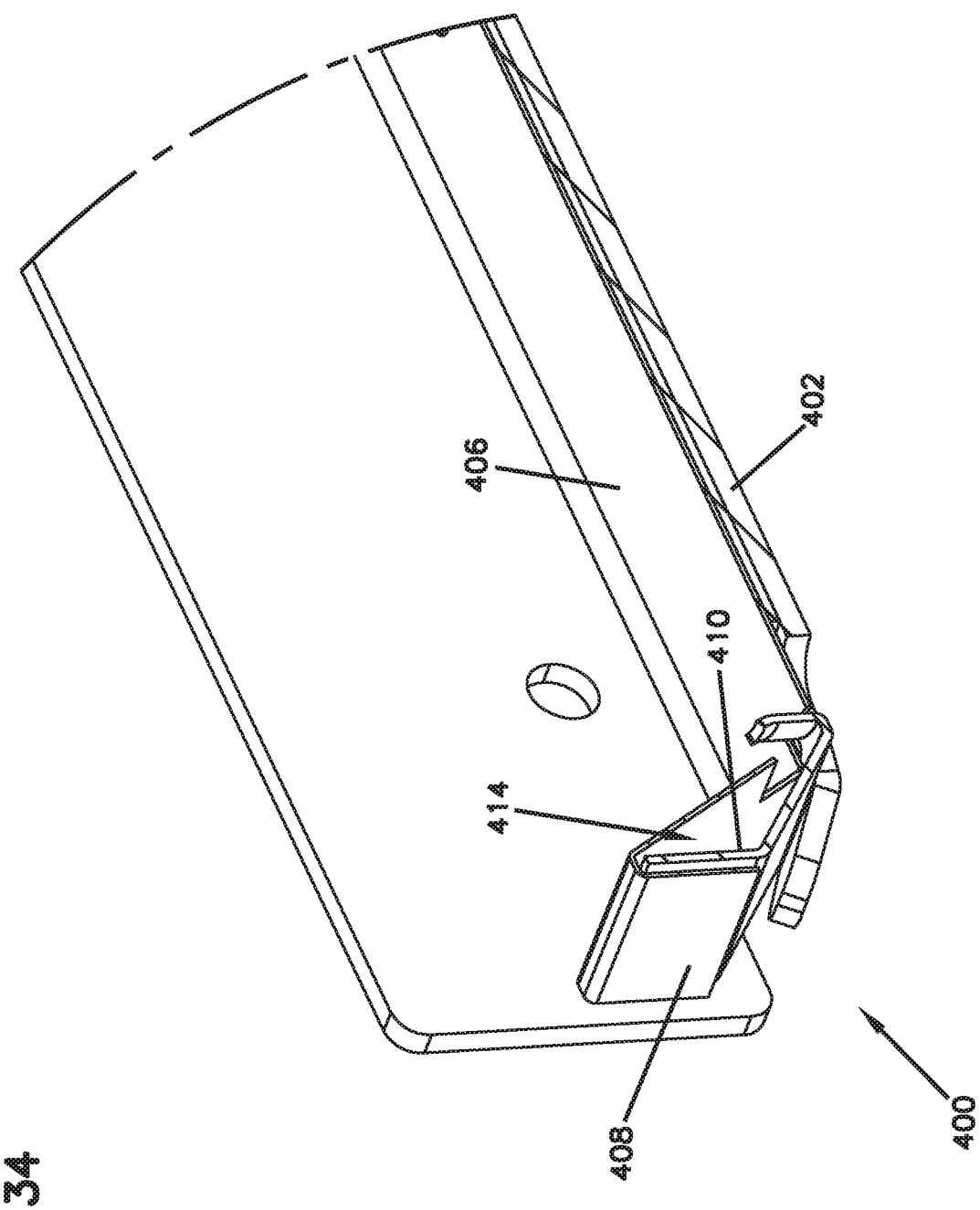
FIG. 34 is a cross-sectional view of the indicator system shown in FIG. 33, as viewed along line $L_3$.

FIGS. 33-34 illustrate the indicator system 400 in a first resting state when the door is open. As shown, when the door opens, the ram supported by the door is also removed from engagement with the deflection arm 406. As the deflection arm 406 is disengaged from the ram, the deflection arm returns, through the power of resistive force applied by the deflection arm, to an at-rest state in engagement with the base floor 402. In the at rest state, the visual indicator 410 returns to a position within the receiver 414 of the cover 408. When the visual indicator 410 is received within the cover 408, the visual stimulus is blocked (or covered) from view and a user does not see the visual stimulus, thus is informed that the door is open.

As illustrated, the visual indicator 410 stimulus can have a planar geometry which is oriented in parallel to the planar outwardly-facing surface of the cover 408. As a result, the visual indicator 410 can nest behind the cover 408 when the door is closed.

Figure 35:
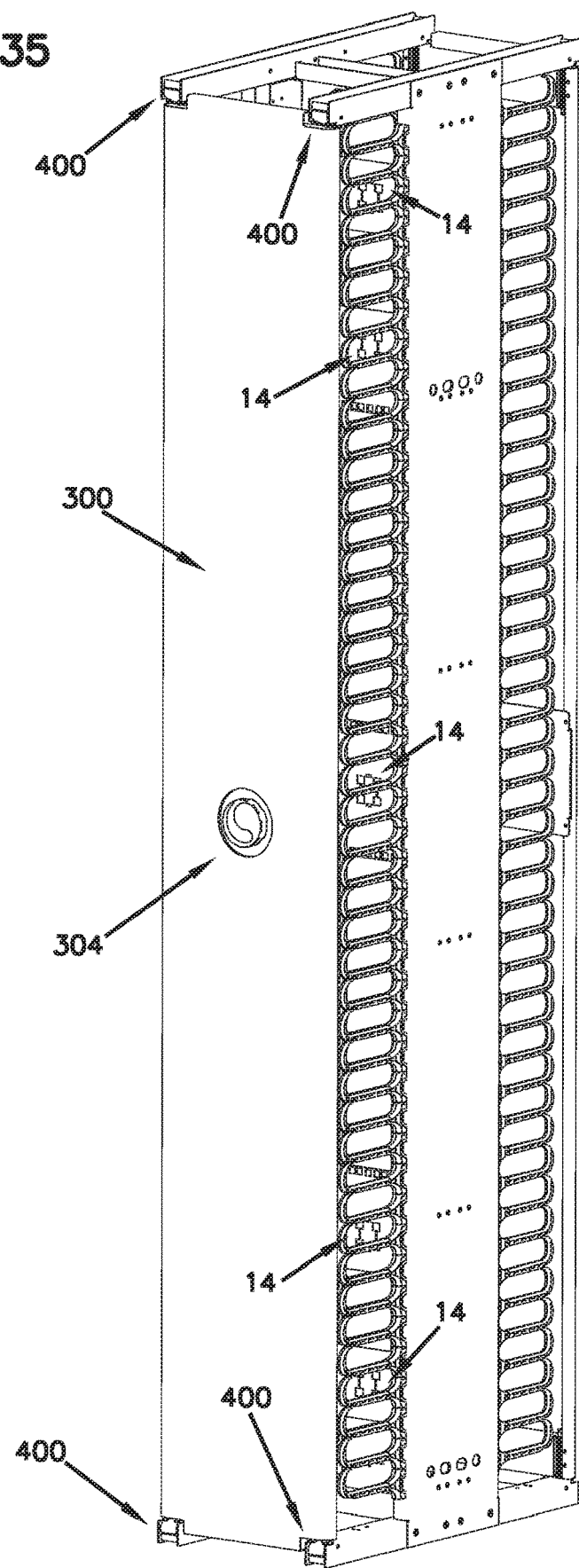
FIG. 35 is a perspective view of a complete storage cabinet, including the cable management system shown in FIGS. 1-21, the door and handle shown in FIGS. 22-30, and the indicator system shown in FIGS. 31-34.

FIG. 35 illustrates a front view of an assembled cabinet for use with managing a plurality of cables. The illustrated cabinet includes the door 300 and handle 304 described above. The illustrated handle 304 is turned in a first or second direction to open the door 300 as described above, and provide access to the above described cable support structure 10 with multiple mounting receiver systems 14 for supporting spools. A plurality of the above described indicator systems 400 are positioned along the top and bottom of the cabinet to indicate when the door 300 is open or closed, as described above. The rear side of the cabinet (not shown) can include a similar structure as the illustrated front, for example, the door 300 and handle 304, the indicators 400 and the interior support structure 10.

PARTS LIST

10 Support Structure
12 Cabinet Frame
14 Mounting Receiver System
16 Grip Aperture
18 Insert Aperture
50 Cable
100 Spool
102 Carrier Body 104 Proximal Mounting End
106 Distal Free End
108 Slot
110 Divider
112 Handle
114 Channel
115 Mounting System
116 Insert Plug
118 Bracket
122 Receiver Space
124 Distal Barrier Wall
126 Proximal Barrier Wall
128 Receiver
130 Locking Mechanism
134 Keyhole
150 Spool
152 Internal Storage Feature
154 Dividers
156 Shoulders
200 Spool
202 Distal Barrier
204 Proximal Barrier
206 Partition
206c Partition Half
206d Partition Half
208 Guide
210 Tracks
214 Follower
230 Spool
232 Guide
234 Partition
236 Follower
238 Teeth
240 Flexing Elements
250 Spool
252 Distal Barrier
254 Proximal Barrier
256 Guide
258 Partition
260 Shoulder
262 Stopper
264 Insert
266 Receiver
268 Track
300 Hinge Control System
301 Handle
302 Door
303 Housing
304 Handle Assembly
306 Hinge Mechanisms
308a Tether
308b Tether
312a Fastener
312b Fastener
314a Biasing Element
314b Biasing Element
316 Mounting Element
318 Barrier
320a Cam Assembly
320b Cam Assembly
322a First Arm
322b First Arm
324a Pivot Arm
324b Pivot Arm
326a Fastener
326b Fastener
328a Guide
328b Guide
330a Follower
330b Follower
332 Handle Switch
334 Fastener
340 Handle
341 Plunger
342 Aperture
344a Receiver
344b Receiver
346 Distal Insert Tip
350 Handle System
352 Handle Switch Assembly
354 Guide
356a Follower
356b Follower
358 Fastener
360 Outer Wall
362 Inner Wall
364 Handle
366 Fastener Receiver
368a Plunger Receiver
368b Plunger Receiver
400 Indicator System
402 Floor
404 Ram
406 Deflection Arm
408 Cover
410 Visual Indicator
414 Receiver
416 Distal Tip
418 Aperture
420 Fixed End
440 First End
450 Second End Aspects of the present disclosure also relate to a cable management device, the cable management device comprising: a cable carrier extending along an axis between a free end and a mounting end; at least one partition repositionably supported by the cable carrier; and a repositioning system for repositioning the at least one partition along the axis to a plurality of positions between the free end and the mounting end of the cable carrier. The repositioning system comprises a plurality of fixed positions for supporting the partition, the plurality of fixed positions being separated from each other. The plurality of fixed positions comprise a plurality of receivers for receiving the at least one partition. The plurality of receivers comprise a plurality of apertures in the cable carrier. The plurality of receivers comprise a plurality of locking mechanisms for releasably fixing the at least one partition to the plurality of fixed positions. The plurality of locking mechanisms comprise a plurality of deflection arms defining a resistive force applied toward the at least one partition. The plurality of fixed positions comprise a plurality of stoppers for releasably stopping the at least one partition from moving along the axis to a plurality of positions between the free end and the mounting end of the cable carrier. The plurality of stoppers comprise an insert and the at least one partition comprises a receiver to removably receive the stopper insert. The repositioning system comprises a guide extending along the axis between the mounting end and the free end, and the at least one partition comprises a follower that travels along the guide. The guide comprises a ratcheting surface. The ratcheting surface comprises a plurality of peaks and valleys, and the follower comprises a plurality of teeth to disengagably engage the plurality of peaks and valleys. The cable management device further comprising a storage support to store at least one of the at least one partition when not in use. The at least one partition comprises a planar plate with a receiver to releasably secure to the repositioning system. The cable carrier mounting end comprises a mounting system. The mounting system comprises at least one bracket. The mounting system comprises an insert plug. The insert plug is pivotally secured with respect to the cable carrier. The cable carrier comprises a pair of halves. The pair of halves are identical. Each half comprises at least one partition and at least one repositioning system. Each half further comprises a mounting system. Each half comprises a distal barrier at the free end and a proximal barrier at the mounting end.

Aspects of the present disclosure also relate to a method for managing cable, the method comprising: mounting a cable carrier to a base, the cable carrier comprising a repositionable cable management system and at least one divider; positioning the at least one divider to a first position on the repositionable cable management system; and receiving at least one length of cable on the cable carrier. The repositionable cable management system comprises a plurality of fixed positions for supporting the at least one divider, the plurality of fixed positions being separated from each other. The method further comprising repositioning the at least one divider to a different second position on the repositionable cable management system. The repositionable cable management system comprises a plurality of fixed positions for supporting the at least one divider, the plurality of fixed positions being separated from each other. The repositionable cable management system comprises a guide extending along an axis between a distal end and a proximal end, and the at least one divider comprises a follower that travels along the guide.

Aspects of the present disclosure also relate to a cable management device, the cable management device comprising: a spool extending along an axis between a free end and a mounting end; at least one partition plate repositionably supported by the spool; and a repositioning system for repositioning the at least one partition plate along the axis to a plurality of positions between the free end and the mounting end of the spool. The repositioning system comprises a plurality of fixed positions for supporting the at least one partition plate, the plurality of fixed positions being separated from each other. The repositioning system comprises a guide extending along an axis between a distal end and a proximal end, and the at least one partition plate comprises a follower that travels along the guide. A base comprising at least one mounting receiver for receiving at least one cable management device. The base comprises a frame.

Aspects of the present disclosure also relate to a cable management system comprising: a base comprising a mounting receiver; a carrier comprising a mounting end and a free end, the mounting end comprising a mounting assembly removably mounted to the base mounting receiver; at least one selectable partition system supported by the carrier, the selectable partition system comprising at least one partition selectably supported at a plurality of positions between the mounting end and the free end.

Aspects of the cable management features may be characterized by:
 1. A cable management device, the cable management device comprising:
 a cable carrier extending along an axis between a free end and a mounting end;
 at least one partition selectably supported by the cable carrier; and
 a repositioning system for repositioning the at least one partition along the axis to a plurality of positions between the free end and the mounting end of the cable carrier.
 2. The cable management device of claim 1, wherein the repositioning system comprises a plurality of fixed positions for supporting the partition, the plurality of fixed positions being separated from each other.
 3. The cable management device of claim 2, wherein the plurality of fixed positions comprise a plurality of receivers for receiving the at least one partition.
 4. The cable management device of claim 3, wherein the plurality of receivers comprise a plurality of apertures in the cable carrier.
 5. The cable management device of claim 3, wherein the plurality of receivers comprise a plurality of locking mechanisms for releasably fixing the at least one partition to the plurality of fixed positions.
 6. The cable management device of claim 5, wherein the plurality of locking mechanisms comprise a plurality of deflection arms defining a resistive force applied toward the at least one partition.
 7. The cable management device of claim 2, wherein the plurality of fixed positions comprise a plurality of stoppers for releasably stopping the at least one partition from moving along the axis to a plurality of positions between the free end and the mounting end of the cable carrier.
 8. The cable management device of claim 7, wherein the plurality of stoppers comprise an insert and the at least one partition comprises a receiver to removably receive the stopper insert.
 9. The cable management device of claim 1, wherein the repositioning system comprises a guide extending along the axis between the mounting end and the free end, and the at least one partition comprises a follower that travels along the guide.
 10. The cable management device of claim 9, wherein the guide comprises a ratcheting surface.
 11. The cable management device of claim 9, wherein the ratcheting surface comprises a plurality of peaks and valleys, and the follower comprises a plurality of teeth to disengaably engage the plurality of peaks and valleys.
 12. The cable management device of claim 1, further comprising a storage support to store at least one of the at least one partition when not in use.
 13. The cable management device of claim 1, wherein the at least one partition comprises a planar plate with a receiver to releasably secure to the repositioning system.
 14. The cable management device of claim 1, wherein the cable carrier mounting end comprises a mounting system.
 15. The cable management device of claim 14, wherein the mounting system comprises at least one bracket.
 16. The cable management device of claim 14, wherein the mounting system comprises an insert plug.
 17. The cable management device of claim 16, wherein the insert plug is pivotally secured with respect to the cable carrier.
 18. The cable management device of any of the preceding claims, wherein the cable carrier comprises a pair of halves.
 19. The cable management device of claim 18, wherein the pair of halves are identical.

20. The cable management device of claim 18, wherein each half comprises at least one partition and at least one repositioning system.
21. The cable management device of claim 20, wherein each half further comprises a mounting system.
22. The cable management device of claim 18, wherein each half comprises a distal barrier at the free end and a proximal barrier at the mounting end.
23. A cable management device, the cable management device comprising:
a spool extending along an axis between a free end and a mounting end;
at least one partition plate repositionably supported by the spool; and
a repositioning system for repositioning the at least one partition plate along the axis to a plurality of positions between the free end and the mounting end of the spool.
24. The cable management device of claim 23, wherein the repositioning system comprises a plurality of fixed positions for supporting the at least one partition plate, the plurality of fixed positions being separated from each other.
25. The cable management device of claim 24, wherein the repositioning system comprises a guide extending along an axis between a distal end and a proximal end, and the at least one partition plate comprises a follower that travels along the guide.
26. A cable management system comprising a base comprising at least one mounting receiver for receiving at least one cable management device from any of the preceding claims.
27. The cable management system of claim 26, wherein the base comprises a frame.
28. A cable management system comprising:
a base comprising a mounting receiver;
a carrier comprising a mounting end and a free end, the mounting end comprising a mounting assembly removably mounted to the base mounting receiver;
at least one selectable partition system supported by the carrier, the selectable partition system comprising at least one partition selectably supported at a plurality of positions between the mounting end and the free end.
29. A method for managing cable, the method comprising:
mounting a cable carrier to a base, the cable carrier comprising a repositionable cable management system and at least one divider;
positioning the at least one divider to a first position on the repositionable cable management system; and
receiving at least one length of cable on the cable carrier.
30. The method of claim 29, wherein the repositionable cable management system comprises a plurality of fixed positions for supporting the at least one divider, the plurality of fixed positions being separated from each other.
31. The method of claim 30, wherein the repositionable cable management system comprises a guide extending along an axis between a distal end and a proximal end, and the at least one divider comprises a follower that travels along the guide.
32. The method of claim 29, further comprising repositioning the at least one divider to a different second position on the repositionable cable management system.

In another aspect, the present invention relates to a system for opening a door that includes a first side edge and an opposite second side edge. The system includes a handle that is mechanically operable in a first direction to open the door only along the first side edge, or in a second direction to open the door only along the second side edge. The system also includes a first hinge mechanism that is operably connected to the handle to releasably secure the door along the first side edge. The system also includes a second hinge mechanism that is operably connected to the handle to releasably secure the door along the second side edge.

In another aspect, the present invention relates to a method of opening a door along either a first side edge or a second side edge with a single handle. The method includes rotating a handle in a first direction to release the first side edge of the door from a fixed condition while maintaining the second side edge of the door in a fixed condition. The method alternatively includes rotating the handle in a second direction to release the second side edge of the door from a fixed condition while maintaining the first side edge of the door in a fixed condition.

Aspects of the present disclosure also relate to a system for opening a door comprising a first side edge and an opposite second side edge, the system comprising: a handle being mechanically operable in a first direction to open the door only along the first side edge or in a second direction to open the door only along the second side edge; a first hinge mechanism operably connected to the handle to releasably secure the door along the first side edge; and a second hinge mechanism operably connected to the handle to releasably secure the door along the second side edge. The handle is rotatable in the first direction and oppositely in the second direction. The system further comprising a hinge control system operably connecting the handle and the first and second hinge mechanisms, the hinge control system comprising: a handle switch in operable communication with the handle; a first cam assembly operably connecting the handle switch and the first hinge mechanism, rotation of the handle switch in a first direction actuates the first cam assembly; a second cam assembly operably connecting the handle switch and the second hinge mechanism, rotation of the handle switch in the second direction actuates the second cam assembly. The handle switch comprises a first follower operably connected to the first cam assembly, and a second follower operably connected to the second cam assembly. The first cam assembly actuates the first hinge mechanism to release from the door, and the second cam assembly actuates the second hinge mechanism to release from the door. The system further comprising at least one first tether connecting the first cam assembly and the first hinge system, and at least one second tether connecting the second cam assembly and the second hinge system. The first cam assembly comprises a first jaw mechanism manipulated by the handle switch to actuate the first hinge mechanism, and the second cam assembly comprises a second jaw mechanism manipulated by the handle switch to actuate the second hinge mechanism. The first jaw mechanism comprises a pair of pivot arms hingedly moveable with respect to each other, and the second jaw mechanism comprises a pair of pivot arms hingedly moveable with respect to each other. The first hinge mechanism comprises at least one first spring mounted pin, and the second hinge mechanism comprises at least one second spring mounted pin. The system further comprising an anti-reversal mechanism to restrict the handle from operating in the second direction when the door is open along the first side edge, and to restrict the handle from operating in the first direction when the door is open along the second side edge.

Aspects of the present disclosure also relate to a method of opening a door along either a first side edge or a second side edge with a single handle, the method comprising: rotating a handle in a first direction to release the first side edge of the door from a fixed condition while maintaining the second side edge of the door in a fixed condition; or rotating the handle in a second direction to release the second side edge of the door from a fixed condition while maintaining the first side edge of the door in a fixed condition. Rotating the handle in the first direction actuates a first hinge mechanism to release from the door, and rotating the handle in the second direction actuates a second hinge mechanism to release from the door. A first cam assembly is operably connected between the handle and the first hinge mechanism, and a second cam assembly is operably connected between the handle and the second hinge mechanism. At least one first tether connects the first cam assembly and the first hinge mechanism, and at least one second tether connects the second cam assembly and the second hinge mechanism. The first and second cam assemblies comprise jaw mechanisms which pivot when the cam assemblies are actuated. The method further comprising restricting the handle from operating in the second direction when the door is open along the first side edge, and restricting the handle from operating in the first direction when the door is open along the second side edge.

Aspects of the present disclosure also relate to an assembly for opening a door comprising a first side edge and an opposite second side edge, the system comprising: a handle assembly being rotatable in a first direction to open the door only along the first side edge or in a second direction to open the door only along the second side edge, the handle assembly comprising a handle mechanically connected to a first cam assembly and a second cam assembly; a first hinge mechanism operably connected to the first cam assembly when the handle is rotated in the first direction; and a second hinge mechanism operably connected to the second cam assembly when the handle is rotated in the second direction. The assembly further comprising a first tether assembly operably extending between the first cam assembly and the first hinge mechanism, and a second tether assembly extending between the second cam assembly and the second hinge mechanism.

Aspects of the door opening features may be characterized by:

1. A system for opening a door comprising a first side edge and an opposite second side edge, the system comprising:
   a handle being mechanically operable in a first direction to open the door only along the first side edge or in a second direction to open the door only along the second side edge;
   a first hinge mechanism operably connected to the handle to releasably secure the door along the first side edge; and
   a second hinge mechanism operably connected to the handle to releasably secure the door along the second side edge.

2. The system of claim 1, wherein the handle is rotatable in the first direction and oppositely in the second direction.

3. The system of claim 2, further comprising a hinge control system operably connecting the handle and the first and second hinge mechanisms, the hinge control system comprising:
   a handle switch in operable communication with the handle;
   a first cam assembly operably connecting the handle switch and the first hinge mechanism, rotation of the handle switch in a first direction actuates the first cam assembly;
   a second cam assembly operably connecting the handle switch and the second hinge mechanism, rotation of the handle switch in the second direction actuates the second cam assembly.

4. The system of claim 3, wherein the handle switch comprises a first follower operably connected to the first cam assembly, and a second follower operably connected to the second cam assembly.

5. The system of claim 3, wherein the first cam assembly actuates the first hinge mechanism to release from the door, and the second cam assembly actuates the second hinge mechanism to release from the door.

6. The system of claim 3, further comprising at least one first tether connecting the first cam assembly and the first hinge system, and at least one second tether connecting the second cam assembly and the second hinge system.

7. The system of any of the preceding claims, wherein the first cam assembly comprises a first jaw mechanism manipulated by the handle switch to actuate the first hinge mechanism, and the second cam assembly comprises a second jaw mechanism manipulated by the handle switch to actuate the second hinge mechanism.

8. The system of claim 7, wherein the first jaw mechanism comprises a pair of pivot arms hingedly moveable with respect to each other, and the second jaw mechanism comprises a pair of pivot arms hingedly moveable with respect to each other.

9. The system of claim 1, wherein the first hinge mechanism comprises at least one first spring mounted pin, and the second hinge mechanism comprises at least one second spring mounted pin.

10. The system of claim 1, further comprising an anti-reversal mechanism to restrict the handle from operating in the second direction when the door is open along the first side edge, and to restrict the handle from operating in the first direction when the door is open along the second side edge.

11. A method of opening a door along either a first side edge or a second side edge with a single handle, the method comprising:
   rotating a handle in a first direction to release the first side edge of the door from a fixed condition while maintaining the second side edge of the door in a fixed condition; or
   rotating the handle in a second direction to release the second side edge of the door from a fixed condition while maintaining the first side edge of the door in a fixed condition.

12. The method of claim 11, wherein rotating the handle in the first direction actuates a first hinge mechanism to release from the door, and rotating the handle in the second direction actuates a second hinge mechanism to release from the door.

13. The method of claim 12, wherein a first cam assembly is operably connected between the handle and the first hinge mechanism, and a second cam assembly is operably connected between the handle and the second hinge mechanism.

14. The method of claim 13, wherein at least one first tether connects the first cam assembly and the first hinge mechanism, and at least one second tether connects the second cam assembly and the second hinge mechanism.
15. The method of claim 13, wherein the first and second cam assemblies comprise jaw mechanisms which pivot when the cam assemblies are actuated.
16. The method of claim 1, further comprising restricting the handle from operating in the second direction when the door is open along the first side edge, and restricting the handle from operating in the first direction when the door is open along the second side edge.
17. An assembly for opening a door comprising a first side edge and an opposite second side edge, the system comprising:
a handle assembly being rotatable in a first direction to open the door only along the first side edge or in a second direction to open the door only along the second side edge, the handle assembly comprising a handle mechanically connected to a first cam assembly and a second cam assembly;
a first hinge mechanism operably connected to the first cam assembly when the handle is rotated in the first direction; and
a second hinge mechanism operably connected to the second cam assembly when the handle is rotated in the second direction.
18. The assembly of claim 17, further comprising a first tether assembly operably extending between the first cam assembly and the first hinge mechanism, and a second tether assembly extending between the second cam assembly and the second hinge mechanism.

In further aspects, the present invention relates to an indicator to show the status of a door as being open or closed, the indicator comprising: an indicator comprising an indicator stimulus that indicates when a door is closed; and a cover to block the indicator stimulus to indicate when the door is open, the cover being manipulated by the condition of the door as being open or closed. The cover has a resting state and an active state, and the indicator stimulus blocked by the cover in the resting state. The indicator stimulus is a visible stimulus and the cover covers the visible stimulus when the door is open. The cover comprises an arm extending between a fixed end and a free end, the cover is supported at the free end. The arm deflects away from the door to uncover the visible stimulus when the door is closed. The door comprises a ram that engages the arm to deflect the arm away from the door when the door is closed.

In further aspects, the present invention relates to an indicator system to show the status of a door as being open or closed, the indicator system comprising: a ram fixed to a door, the ram comprising a contact end; an indicator comprising an indicator stimulus that indicates when the door is closed; and a cover to block the indicator stimulus to indicate when the door is open, the cover being manipulated by the ram contact end. The indicator stimulus is a visible stimulus and the cover covers the visible stimulus when the door is open. The cover comprises an arm extending between a fixed end and a free end, the cover is supported at the free end. The arm free end is deflected by the ram contact end to uncover the visible stimulus when the door is closed.

In further aspects, the present invention relates to a method for showing the status of a door as being open or closed, the method comprising: deflecting a cover away from an indicator stimulus by engaging the cover with a ram on a door when the door is closed; and blocking the indicator stimulus with the cover by disengaging the cover from the ram when the door is open. The cover comprises an arm extending between a fixed end and a free end, the arm deflecting with respect to the fixed end. The indicator stimulus is a visible stimulus, the cover receiving the visible stimulus when the door is closed.

In further aspects, the present invention relates to a cabinet comprising: a frame comprising a frame member, the frame member comprising a first extension and a second extension, the second extension movable between first and second states, wherein the first and second extensions overlap in the first state and do not overlap in the second state; a door hingedly secured to the frame with a movable plunger supported on the door, the movable plunger engages the second extension in the second state and does not engage the second extension in the first state.

Although specific embodiments of the disclosure have been described, numerous other modifications and alternative embodiments are within the scope of the disclosure. For example, any of the functionality described with respect to a particular device or component may be performed by another device or component. Further, while specific device characteristics have been described, embodiments of the disclosure may relate to numerous other device characteristics. Further, although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments may not include, certain features, elements, and/or steps. Thus, such conditional language is not generally intended to imply that features, elements, and/or steps are in any way required for one or more embodiments.

We claim:
1. A cable support system, comprising:
a frame;
a cable management device configured to be mounted to the frame, the cable management device including:
a first barrier wall that engages the frame when the cable management device is mounted to the frame;
a second barrier wall;
a cable carrier extending along an axis away from the first barrier wall to the second barrier wall;
a partition; and
a repositioning system for repositioning the partition from a first position to a second position along the axis relative to the first barrier wall, the first position and the second position being between the first barrier wall and the second barrier wall, the repositioning system including a lock having a follower that engages a guide, wherein the partition is locked at each of the first position and the second position by engagement of the follower with the guide, the repositioning system further including a flexing element configured to reflexively return from a flexed condition of the flexing element to a rest condition of the flexing element, the flexing element being further configured to allow the partition to move from the first position to the second position or from the second position to the first position when the flexing element is in the flexed condition and without the follower being flexed.

2. The cable support system of claim 1, wherein the repositioning system includes fixed positions for supporting the partition, the fixed positions being separated from each other.

3. The cable support system of claim 2, wherein the fixed positions include receivers for receiving the partition.

4. The cable support system of claim 3, wherein the receivers include locking mechanisms for releasably fixing the partition to the fixed positions.

5. The cable support system of claim 2, wherein the fixed positions include stoppers for releasably stopping the partition from moving along the axis.

6. The cable support system of claim 1, wherein the guide includes a ratcheting surface having peaks and valleys, and the follower includes a tooth to disengageably engage the peaks and valleys.

7. The cable support system of claim 1, wherein the partition includes the follower.

8. The cable support system of claim 1, wherein the partition includes a planar plate with a receiver to releasably secure to the repositioning system.

9. The cable support system of claim 1, wherein the cable management device includes a mounting system for mounting the cable management device to the frame.

10. The cable support system of claim 9, wherein the mounting system includes a bracket.

11. The cable support system of claim 9, wherein the mounting system includes an insert plug pivotally secured with respect to the cable carrier.

12. The cable support system of claim 1, wherein the cable carrier includes a pair of spool halves.

13. The cable support system of claim 12, wherein the spool halves are of identical construction.

14. The cable support system of claim 13, wherein each of the spool halves includes a partition, a partition repositioning system, and a mounting system for mounting to the frame.

15. The cable support system of claim 1, wherein the cable carrier includes a spool extending from the second barrier wall toward the first barrier wall along the axis.

16. The cable support system of claim 1, including a plurality of the cable management devices.

17. A cable management cabinet including the cable support system of claim 1, a moveable door and a system for opening the door comprising a first side edge and an opposite second side edge, the system comprising:
a handle being mechanically operable in a first direction to open the door only along the first side edge or in a second direction to open the door only along the second side edge;
a first hinge mechanism operably connected to the handle to releasably secure the door along the first side edge; and
a second hinge mechanism operably connected to the handle to releasably secure the door along the second side edge.

18. A cable management cabinet including the cable support system of claim 1, a moveable door, and an indicator to show the status of the moveable door as being open or closed, the indicator comprising:
an indicator stimulus that indicates when the moveable door is closed; and
a cover to block the indicator stimulus to indicate when the moveable door is open, the cover being manipulated by the condition of the moveable door as being open or closed.

19. The cable support system of claim 1, wherein the flexing element includes a channel defined by the partition, the channel being configured to widen as the flexing element moves from the rest condition to the flexed condition.

* * * * *